United States Patent [19]
Morii

[11] Patent Number: 5,424,979
[45] Date of Patent: Jun. 13, 1995

[54] NON-VOLATILE MEMORY CELL

[75] Inventor: Tomoyuki Morii, Ibaragi, Japan

[73] Assignee: Matsushita Electric Industrial Co., Ltd., Kadoma, Japan

[21] Appl. No.: 245,253

[22] Filed: May 17, 1994

Related U.S. Application Data

[63] Continuation-in-part of Ser. No. 112,117, Aug. 26, 1993, abandoned.

[30] Foreign Application Priority Data

| May 21, 1993 | [JP] | Japan | 5-118896 |
| Aug. 19, 1993 | [JP] | Japan | 5-205008 |
| Apr. 19, 1994 | [JP] | Japan | 6-080519 |

[51] Int. Cl.$^6$ .................................... H01L 29/78
[52] U.S. Cl. ........................... 365/185; 365/182; 365/900; 365/218; 257/314; 257/315; 257/316
[58] Field of Search ............... 365/185, 182, 189.01, 365/900, 218; 257/314, 315, 322, 316, 327, 328, 344

[56] References Cited

U.S. PATENT DOCUMENTS

| 5,021,848 | 6/1991 | Chiu | 357/23.5 |
| 5,051,793 | 9/1991 | Wang | 357/23.5 |
| 5,267,194 | 11/1993 | Jang | 365/185 |

FOREIGN PATENT DOCUMENTS

| 58-121679 | 7/1983 | Japan . | |
| 0177075 | 8/1991 | Japan | 305/185 |

OTHER PUBLICATIONS

Hsu et al., "Structure-Enhanced MOSFET Degradation Due to Hot-Electron Injection", IEEE Electron Device Letters, vol. EDL-5, No. 3, Mar. 1984, pp. 71–74.

Primary Examiner—Joseph A. Popek
Assistant Examiner—Huan Hoang
Attorney, Agent, or Firm—Renner, Otto, Boisselle & Sklar

[57] ABSTRACT

A non-volatile memory cell according to the present invention includes: a semiconductor layer of a first conductivity type having an upper portion; a pair of impurity diffusion regions of a second conductivity type provided in the upper portion of the semiconductor layer, facing each other at a certain distance; a channel region provided between the pair of impurity diffusion regions in the upper portion of the semiconductor layer; a gate insulating film provided on the upper portion of the semiconductor layer, having thin portions covering at least part of the pair of impurity diffusion regions and a thick portion covering the channel region; floating gate electrodes provided on the thin portions of the gate insulating film; a control gate electrode provided on the thick portion of the gate insulating film and electrically insulated from the floating gate electrodes; and an insulating film provided between the control gate electrode and the floating gate electrodes, capacity-coupling the control gate electrode with the floating gate electrodes, wherein, during writing data, part of electric carriers in the impurity diffusion regions are injected into the floating gate electrodes through the thin portions of the gate insulating film so as to form a Fowler-Nordheim current, depending upon a voltage to be applied to the control gate electrode, whereby electric resistance of the impurity diffusion regions is changed.

27 Claims, 17 Drawing Sheets

NON-VOLATILE MEMORY CELL

This application is a continuation-in-part of U.S. application Ser. No. 08/112,117, filed Aug. 26, 1993, which is incorporated herein by reference in its entirety, now abandoned.

BACKGROUND OF THE INVENTION

1. Field of the Invention

The present invention relates to a non-volatile memory cell of a side wall accumulation type, and more particularly to a non-volatile memory cell for an electrically erasable programmable read only memory (EEPROM).

2. Description of the Related Art

A non-volatile memory includes erasable programmable read only memories (EPROMs) and EEPROMs.

FIG. 8 shows a non-volatile memory cell of a side wall accumulation type 80 for an EPROM. Such a memory cell is disclosed in U.S. Pat. No. 5,051,793.

The memory cell 80 includes a p-type silicon substrate 81, a source region 82 and a drain region 83 formed in the substrate 81, a gate insulating film 84 with a uniform thickness formed on the substrate 81, floating gate electrodes 85a and 85b, and a control gate electrode 86 formed on the gate insulating film 84. The floating gate electrodes 85a and 85b are provided on both sides of the control gate electrode 86 as a pair of side walls. The floating gate electrodes 85a and 85a and the control electrode 86 are electrically insulated from each other by an insulating film formed therebetween. The width (T) of the control gate electrode 86 (i.e., the size in the channel length direction) is smaller than the channel length (L), and the floating gate electrodes 85a and 85b cover a part of a channel via the gate insulating film 84.

When the electric potential of the drain region 83 is made sufficiently higher than that of the source region 82, electrons emitted from the source region 82 are accelerated toward the drain region 83 in an electric field formed between the source region 82 and the drain region 83. The accelerated electrons cause an avalanche breakdown in the vicinity of the drain region 83, generating a plurality of high energy electrons (hot electrons). Part of the generated hot electrons jump over the electric potential barrier of the gate insulating film 84 to be injected into the floating gate electrode 85b on the side of the drain region 83. When hot electrons are injected into the floating gate electrode 85b, the electric potential of the floating gate electrode 85b is lowered, resulting in an increase in the inversion threshold voltage of the memory cell 80.

In this way, each memory cell takes one of two electrically stable states (i.e., logic "high" and logic "low") in accordance with the level of the inversion threshold voltage. As a result, each memory cell can store 1-bit data. For example, among a plurality of non-volatile memory cells formed in a matrix, the inversion threshold voltage of a desired memory cell is selectively set at a high level and those of the other memory cells are set at a low level, whereby the desired data can be stored.

The above-mentioned non-volatile memory cell of a side wall accumulation type has the following problems:

The read error of data can be prevented by increasing the quantity of the hot electrons to be injected into the floating gate electrode 85b. Therefore, the electric field in the vicinity of the drain region 83 should be made stronger. In order to make the electric field stronger, a higher electric potential should be applied to the drain region 83. However, in the case where such a high electric potential is applied to the drain region 83, a depletion layer formed in the vicinity of the pn junction between the n-type drain region 83 and the p-type substrate 81 deeply extends toward the source region 82. As a result, the hot electrons generated due to the avalanche breakdown are injected into a portion of the gate insulating film 84 right under the control gate electrode 86. In order to avoid the injection of the hot electrons into the gate insulating film 84, the electric potential to be applied to the drain region 83 should be decreased. However, a decreased electric potential applied to the drain region 83 decreases the quantity of hot electrons (write capacity) to be injected into the floating gate electrode 85b. This will cause a read error of data.

SUMMARY OF THE INVENTION

The non-volatile memory cell of the present invention comprises:

a semiconductor layer of a first conductivity type having an upper portion;

a pair of impurity diffusion regions of a second conductivity type provided in the upper portion of the semiconductor layer, facing each other at a certain distance;

a channel region provided between the pair of impurity diffusion regions in the upper portion of the semiconductor layer;

a gate insulating film provided on the upper portion of the semiconductor layer, having thin portions covering at least part of the pair of impurity diffusion regions and a thick portion covering the channel region;

floating gate electrodes provided on the thin portions of the gate insulating film;

a control gate electrode provided on the thick portion of the gate insulating film and electrically insulated from the floating gate electrodes; and an insulating film provided between the control gate electrode and the floating gate electrodes, capacity-coupling the control gate electrode with the floating gate electrodes, wherein, during writing data, part of electric carriers in the impurity diffusion regions are injected into the floating gate electrodes through the thin portions of the gate insulating film so as to form a Fowler-Nordeim current, depending upon a voltage to be applied to the control gate electrode, whereby electric resistance of the impurity diffusion regions is changed.

Alternatively, the non-volatile memory cell of the present invention comprises:

a semiconductor layer of a first conductivity type having an upper portion;

a source region of a second conductivity type and a drain region of the second conductivity type provided in the upper portion of the semiconductor layer, facing each other at a certain distance;

a channel region provided between the source region and the drain region in the upper portion of the semiconductor layer;

a first gate insulating film provided on the upper portion of the semiconductor layer, having a first portion covering at least part of the source region, a second portion covering at least part of the drain region, and a third portion covering the channel region;

a first floating gate electrode provided on the first portion of the first gate insultating film;

a second floating gate electrode provided on the second portion of the first gate insulating film;

a control gate electrode provided on the third portion of the first gate insulating film and electrically insulated from the first and second floating gate electrodes;

a first insulating film provided between the control gate electrode and the first floating gate electrode, capcity-coupling the control gate electrode with the first floating gate electrode; and a second insulating film provided between the control gate electrode and the second floating gate electrode, capacity-coupling the control gate electrode with the second floating gate electrode, wherein a degree of capacitive coupling due to the first insulating film is different from a degree of capacitive coupling due to the second insulating film, wherein, during writing data, part of electric carriers in the source region and/or the drain region are injected into the first floating gate electrode and/or the second floating gate electrode through the first portion and/or the second portion of the first gate insulating film so as to form a Fowler-Nordheim current, depending upon a voltage to be applied to the control gate electrode.

In one embodiment of the present invention, a thickness of the first insulating film is different from a thickness of the second insulating film.

In another embodiment of the present invention, a dielectric constant of the first insulating film is different from a dielectric constant of the second insulating film.

In another embodiment of the present invention, the above-mentioned non-volatile memory cell further comprises:

a second gate insulating film provided so as to cover the first and second floating gate electrodes, having a first portion covering the first floating gate electrode and a second portion covering the second floating gate electrode;

a third floating gate electrode provided on the first portion of the second gate insulating film; and a fourth floating gate electrode provided on the second portion of the second gate insulating film, wherein the third and fourth floating gate electrodes are capacity-coupled with the control gate electrode, wherein, during writing data, part of electric carriers in the source region and/or the drain region are injected into the first floating gate electrode and/or the second floating gate electrode through the first portion and/or the second portion of the first gate insulating film and are injected into the third floating gate electrode and/or the fourth floating gate electrode through the first portion and/or the second portion of the second gate insulating film so as to form a Fowler-Nordheim current, depending upon a voltage to be applied to the control gate electrode.

Alternatively, the non-volatile memory cell of the present invention comprises:

a semiconductor layer of a first conductivity type having an upper portion;

a source region of a second conductivity type and a drain region of the second conductivity type provided in the upper portion of the semiconductor layer, facing each other at a certain distance;

a channel region provided between the source region and the drain region in the upper portion of the semiconductor layer;

a first gate insulating film provided on the upper portion of the semiconductor layer, having a first portion covering at least part of the source region, a second portion covering at least part of the drain region, and a third portion covering the channel region;

a first floating gate electrode provided on the first portion of the first gate insulating film;

a second floating gate electrode provided on the second portion of the first gate insulating film;

a control gate electrode provided on the third portion of the first gate insulating film and electrically insulated from the first and second floating gate electrodes;

a second gate insulating film provided so as to cover the first and second floating gate electrodes, having a first portion covering the first floating gate electrode and a second portion covering the second floating gate electrode;

a third floating gate electrode provided on the first portion of the second gate insulating film; and a fourth floating gate electrode provided on the second portion of the second gate insulating film, wherein the first, second, third, and fourth floating gate electrodes are capacity-coupled with the control gate electrode, wherein, during writing data, part of electric carriers in the source region and/or the drain region are injected into the first floating gate eletrode and/or the second floating gate electrode through the first portion and/or the second portion of the first gate insulating film and are injected into the third floating gate electrode and/or the fourth floating gate electrode through the first portion and/or the second portion of the second gate insulating film so as to form a Fowler-Nordheim current, depending upon a voltage to be applied to the control gate electrode.

In one embodiment of the present invention, a thickness of the first portion of the first gate insulating film is equal to a thickness of the second portion of the first gate insulating film.

In another embodiment of the present invention, a thickness of the first portion of the second gate insulating film is equal to a thickness of the second portion of the second gate insulating film.

In another embodiment of the present invention, the thickness of the first portion of the first gate insulating film is smaller than the thickness of the second portion of the first gate insulating film.

In another embodiment of the present invention, the thickness of the second portion of the second gate insulating film is smaller than the thickness of the first portion of the second gate insulating film.

In another embodiment of the present invention, the control gate electrode completely covers the channel region.

In another embodiment of the present invention, the control gate electrode covers on part of the channel region, and at least one of the first and second floating gate electrodes covers another part of the channel region.

Alternatively, the non-volatile memory cell of the present invention comprises:

a semiconductor layer of a first conductivity type having an upper portion;

a source region of a second conductivity type and a drain region of the second conductivity type provided in the upper portion of the semiconductor layer, facing each other at a certain distance;

a channel region provided between the source region and the drain region in the upper portion of the semiconductor layer;

a first gate insulating film provided on the upper portion of the semiconductor layer, having a first portion covering one part of the source region, a second portion covering one part of the drain region, and a third portion covering the channel region;

a second gate insulating film provided on the upper portion of the semiconductor layer, having a first portion covering another part of the source region, and a second portion covering another part of the drain region;

a first floating gate electrode provided on the first portion of the first gate insulating film;

a second floating gate electrode provided on the second portion of the first gate insulating film;

a control gate electrode provided on the third portion of the first gate insulating film and electrically insulated from the first and second floating gate electrodes;

a third floating gate electrode provided on the first portion of the second gate insulating film; and a fourth floating gate electrode provided on the second portion of the second gate insulating film, wherein the first, second, third, and fourth floating gate electrodes are capacity-coupled with the control gate electrode, wherein, during writing data, part of electric carriers in the source region and/or the drain region are injected into the first floating gate electrode and/or the second floating gate electrode through the first portion and/or second portion of the first gate insulating film and are injected into the third floating gate electrode an/or the fourth floating gate electrode through the first portion and/or the second portion of the second gate insulating film so as to form a Fowler-Nordheim current, depending upon a voltage to be applied to the control gate electrode.

In one embodiment of the present invention, a thickness of the first portion of the first gate insulating film is equal to a thickness of the second portion of the first gate insulating film.

In another embodiment of the present invention, a thickness of the first portion of the second gate insulating film is equal to a thickness of the second portion of the second gate insulating film.

In another embodiment of the present invention, the thickness of the first portion of the first gate insulating film is smaller than the thickness of the second portion of the first gate insulating film.

In another embodiment of the present invention, the thickness of the second portion of the second gate insulating film is smaller than the thickness of the first portion of the second gate insulating film.

In another embodiment of the present invention, the control gate electrode completely covers the channel region.

In another embodiment of the present invention, the control gate electrode covers one part of the channel region, and at least one of the first and second floating gate electrodes covers another of the channel region.

Alternatively, the non-volatile memory cell of the present invention comprises:

a semiconductor layer of a first conductivity type having an upper portion;

a source region of a second conductivity type and a drain region of the second conductivity type provided in the upper portion of the semiconductor layer, facing each other at a certain distance;

a channel region provided between the source region and the drain region in the upper portion of the semiconductor layer;

a first gate insulating film provided on the upper portion of the semiconductor layer, having a first portion covering a part of the source region, a second portion covering a part of the drain region, and a third portion covering the channel region;

an insulating film provided on the upper portion of the semiconductor layer, having a first portion covering another part of the source region and a second portion covering another part of the drain region;

a first floating gate electrode provided on the first portion of the first gate insulating film;

a second floating gate electrode provided on the second portion of the first gate insulating film;

a third floating gate electrode provided on the first portion of the insulating film;

a fourth floating gate electrode provided on the second portion of the insulating film;

a first portion of a second gate insulating film provided between the first floating gate electrode and the third floating gate electrode; and a second portion of the second gate insulating film provided between the second floating gate electrode and the fourth floating gate electrode, wherein the first, second, third, and fourth floating gate electrodes are capacity-coupled with the control gate electrode, wherein, during writing data, part of electric carriers in the source region and/or the drain region are injected into the first floating gate electrode and/or the second floating gate electrode through the first portion and/or the second portion of the first gate insulating film and are injected into the third floating gate electrode and/or the fourth floating gate electrode through the first portion of the second gate insulating film and/or the second portion of the second gate insulating film so as to form a Fowler-Nordheim current, depending upon a voltage to be applied to the control gate electrode.

According to the present invention, the control gate electrode is capacity-coupled with the floating gate electrodes provided above the source and drain regions. Therefore, the electrons can be injected into the desired floating gate electrodes from the source region and/or the drain region by controlling the voltage applied to the control gate electrode. In this structure, the diffusion layer resistance of the source region and/or the drain region is changed depending upon the quantity of the electric carriers accumulated in the floating gate electrode positioned above the source region and/or the drain region. As a result, the change in resistance of the source region or the drain region can be detected by detecting the level of the drain current during reading data, making it possible to know the electron accumulation state in the floating gate electrodes. Furthermore, according to the present invention, data of a number of values can be stored in each memory cell in a non-volatile manner by using a plurality of floating gate electrodes and controlling the thickness of the gate insulating films across which the electrons pass. Accordingly, the function of the present invention is different from that of the conventional non-volatile memory cell. More specifically, in the memory cell of the present invention, the diffusion layer resistance of the source region and/or the drain region is changed depending upon the electron accumulation state of the floating gate electrodes, whereas in the conventional memory cell, the inversion threshold voltage of the channel region is changed.

Thus, the invention described herein makes possible the advantage of providing a non-volatile memory cell of a side wall accumulation type with large write capacity.

This and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of illustrative examples with reference to the drawings.

Example 1

Figure 1A:
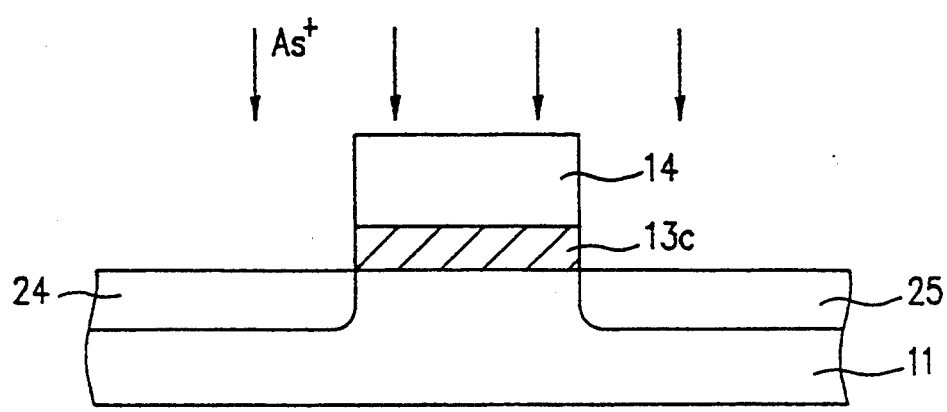
FIGS. 1(a) to 1(c) are cross-sectional views of a non-volatile memory cell according to the present invention, showing the steps of the fabrication thereof.
Figure 1B:
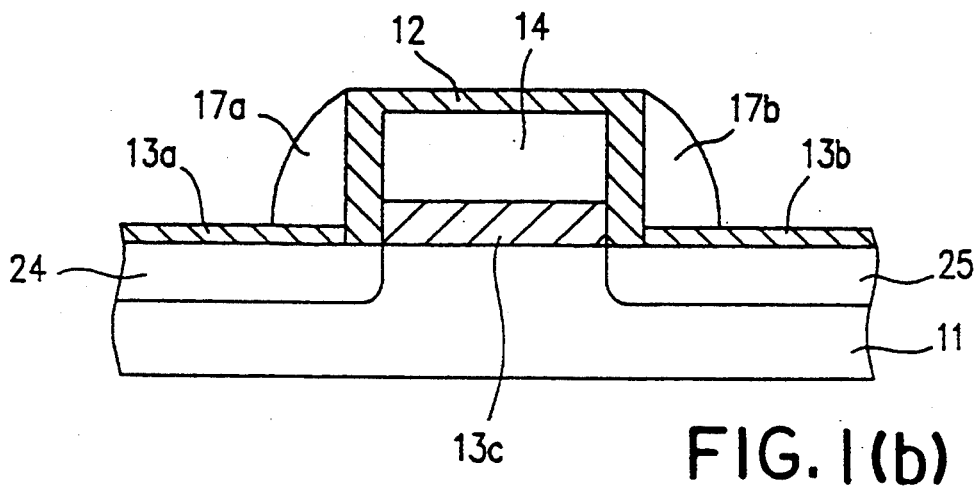
Figure 1C:
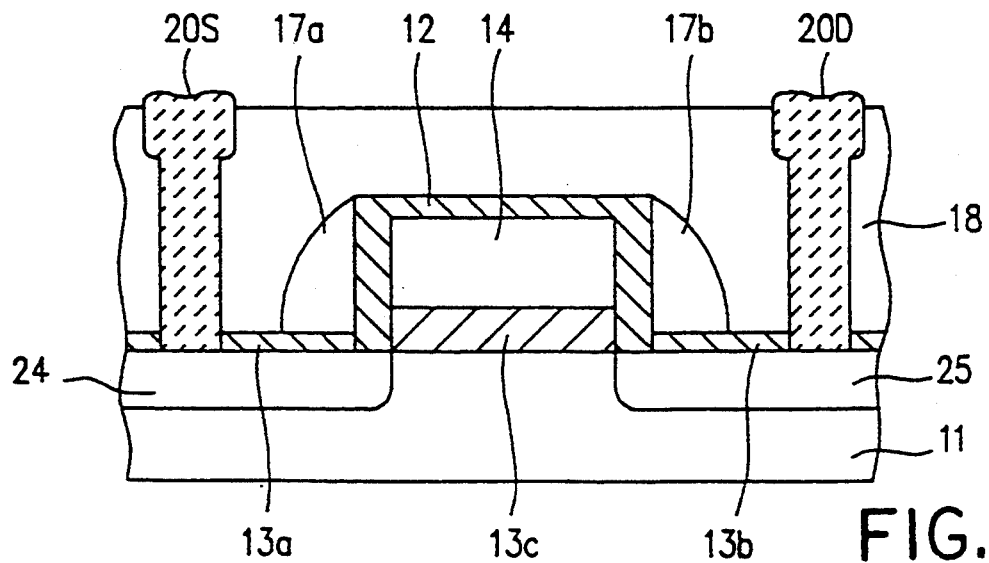

FIG. 1(c) is a cross-sectional view of a non-volatile memory cell of a side wall accumulation type according to the present invention. The present invention will be described by way of an exemplary memory cell fabricated by using a CMOS process for fabricating an LSI with a minimum size of 0.5 to 1.0 $\mu$m.

This memory cell includes an n-type source region 24 and an n-type drain region 25 facing each other at a certain distance (about 0.25 $\mu$m) and a channel region positioned between the source region 24 and the drain region 25. The source region 24 and the drain region 25 are provided in the upper portion of a p-type silicon substrate 11. The source region 24 and the drain region 25 are typically an impurity diffusion region with a thickness of about 0.1 $\mu$m. The surface concentration of n-type impurities doped in the impurity diffusion regions is $10^{20}$ cm$^{-3}$ to $10^{21}$ cm$^{-3}$. In the silicon substrate 11, p-type impurities with a surface concentration of about $10^{17}$ cm$^{-3}$ are doped.

On the silicon substrate 11, a gate insulating film is provided. The gate insulating film includes a first portion 13a, a second portion 13b, and a third portion 13c. The first portion 13a has a thickness of 10 nm and covers the source region 24, the second portion 13b has a thickness of 10 nm and covers the drain region 25, and the third portion 13c has a thickness of 20 nm and covers the channel region. In the present example, the first portion 13a and the second portion 13b has the same thickness and both of the first and second portions 13a and 13b are thinner than the third portion 13c. It is required that the thickness of the first portion 13a and the second portion 13b is set so that a Fowler-Nordheim current (FN current) flows therethrough (i.e., about 5 nm or more). Moreover, it is required that the thickness of the third portion 13c is larger than those of the first and second portions 13a and 13b. Furthermore, the third portion 13c may have a multi-layered structure including an oxide film and a silicon nitride film.

A first floating gate electrode 17a is provided on the first portion 13a, and a second floating gate electrode 17b is provided on the second portion 13b. In addition, a control gate electrode 14 is provided on the third portion 13c. The control gate electrode 14 is electrically insulated from the first floating gate electrode 17a and the second floating gate electrode 17b by an insulating film 12 with a thickness of 15 nm. The control gate electrode 14 and the floating gate electrodes 17a and 17b are typically made of polycrystalline silicon, polycide, etc.

The gate length of the control gate electrode 14 of the present example (measured along the channel length direction) is about 0.25 μm, and the gate width thereof (measured along the direction vertical to the channel length direction) is about 2 μm. The gate length of the floating gate electrodes 17a and 17b is about 0.1 to 0.15 μm, and the gate width thereof is equal to that of the control gate electrode 14.

As shown in FIG. 1(c), the memory cell is covered with an interlevel insulator 18 formed on the silicon substrate 11. Contact holes are provided in the interlevel insulator 18 so as to reach the source region 24 and the drain region 25. In addition, above the silicon substrate 11, a source electrode 20S and a drain electrode 20D are provided. The source electrode 20S comes into contact with the source region 24 through the contact hole and the drain electrode 20D comes into contact with the drain region 25 through the contact hole.

Figure 2:
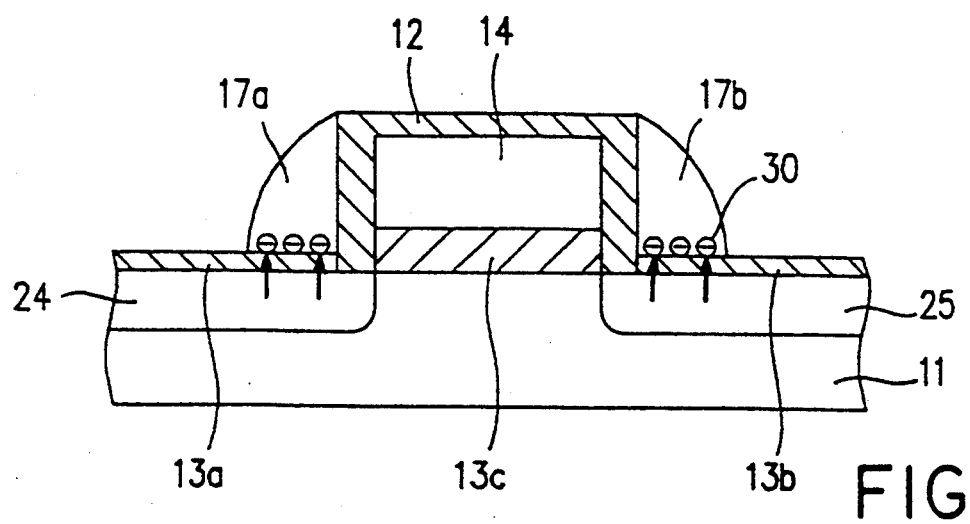
FIGS. 2(a) to 2(c) illustrate the operation of the memory cell shown in FIG. 1(c).
Figure 2B:
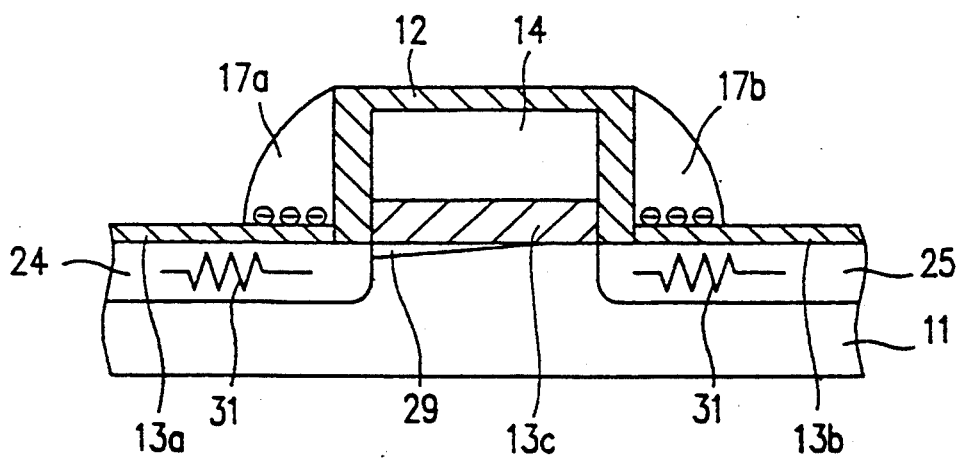
Figure 2C:
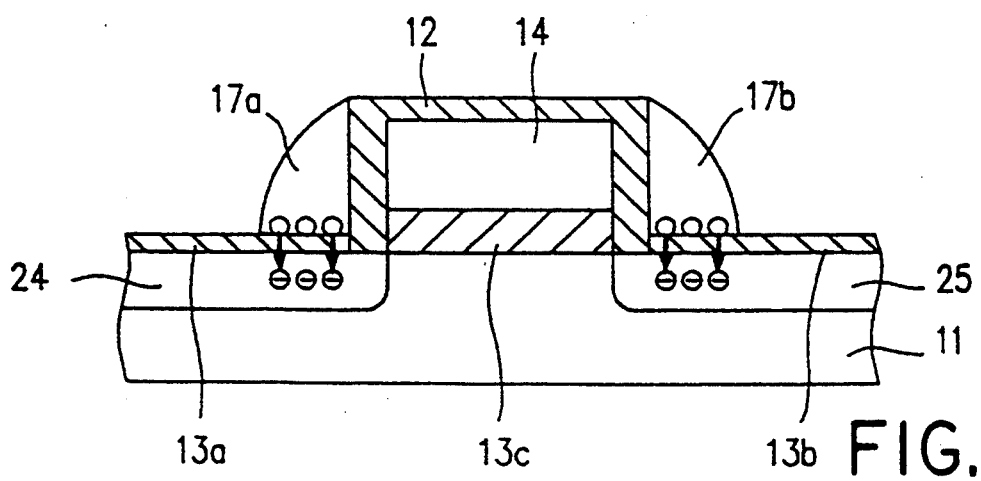

Hereinafter, the operation of the memory cell will be described with reference to FIGS. 2(a) to 2(c).

First, a write operation will be described.

Electric potentials of 10 volts, 0 volt and 0 volt are respectively applied to the control gate electrode 14, the source region 24 (source electrode 20S) and the drain region 25 (drain electrode 20D). The electric potential of the control gate electrode 14 becomes 10 volts with respect to the source region 24 and the drain region 25. Because of the capacitive coupling of the floating gate electrodes 17a and 17b and the control gate electrode 14, the electric potentials of the floating gate electrodes 17a and 17b increase to a level required for generating an FN current. More specifically, when the electric potential of the control gate electrode 14 is increased from 0 volt to 0 volts within about 1 to 2 nanoseconds, the electric potentials of the floating gate electrodes 17a and 17b overshoot to temporarily increase to about 15 volts, for example. As a result, as shown in FIG. 2(a), electrons in the source region 24 and in the drain region 25 pass through the first and second portions 13a and 13b because of the tunnel effect and are injected into the floating gate electrodes 17a and 17b, respectively. After the electrons are injected into the floating gate electrodes 17a and 17b, even though the electric potential of the control gate electrode 14 is decreased below 10 volts, the electrons are retained in the floating gate electrodes 17a and 17b, because the floating gate electrodes 17a and 17b are respectively covered with the insulating films.

Among a plurality of memory cells, the control gate electrodes 14 of selected memory cells are applied with an electric potential of 10 volts and the control gate electrodes 14 of the other memory cells are applied with an electric potential of 0 volt. In this way, electrons are accumulated only in the floating gate electrodes 17a and 17b of the selected memory cells.

Next, the read operation of the memory cell will be described.

Electric potentials of 5 volts, 0 volt and 1 volt are respectively applied to the control gate electrode 14, the source region 24 and the drain region 25, respectively. In the present example, the inversion threshold voltage of the memory cell is set at a value lower than 5 volts (e.g., 1 volt), so that a conductive channel 29 is formed between the source region 24 and the drain region 25, as shown in FIG. 2(b). Electrons transfer from the source region 24 to the drain region 25 through the conductive channel 29. At this time, a drain current at a certain level is obtained.

In the present example, since the floating gate electrodes 17a and 17b are positioned outside the channel region, the inversion threshold voltage of the memory cell in the case where the electrons are not accumulated in the floating gate electrodes 17a and 17b is substantially equal to that in the case where the electrons are accumulated in the floating gate electrodes 17a and 17b. For this reason, in both cases, the similar conductive channel 29 is formed between the source region 24 and the drain region 25, and in both cases, the electrons transfer from the source region 24 to the drain region 25, whereby a drain current can be obtained. However, as shown in FIG. 2(b), when the electrons are accumulated in the floating gate electrodes 17a and 17b, the accumulated electrons increase the diffusion layer resistance (i.e., parasitic resistance 31) of the source region 24 and the drain region 25. Because of this, the level of the drain current obtained in the case where the electrons are accumulated in the floating gate electrodes 17a and 17b is lower than that of the drain current obtained in the case where the electrons are not accumulated in the floating gate electrodes 17a and 17b.

Figure 3:
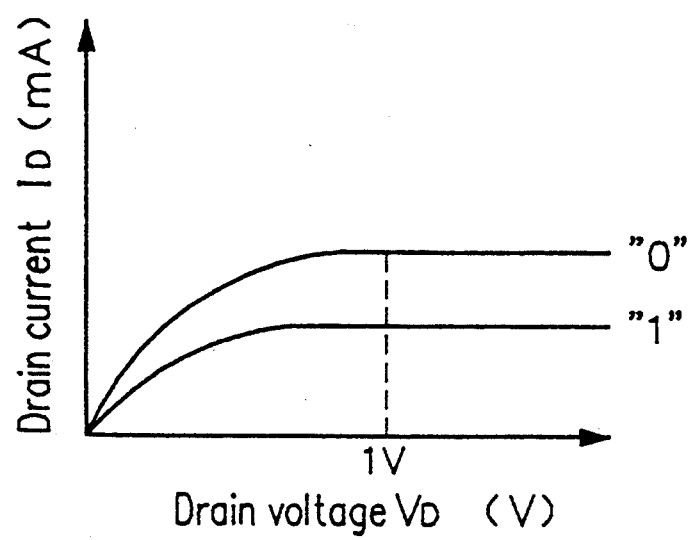
FIG. 3 is a graph showing the relationship between the drain current $I_D$ and the drain voltage $V_D$ in the memory cell shown in FIG. 1(c).

FIG. 3 shows the relationship between the drain current $I_D$ and the drain voltage $V_D$. As is understood from FIG. 3, 1-bit data "0" and "1" are indentified depending upon the level of the drain current $I_D$.

As described above, in the non-volatile memory cell of a side wall accumulation type according to the present invention, 1-bit data is not stored depending upon the level of the inversion threshold voltage. According to the present invention, 1-bit data is stored depending upon the level of the parasitic resistance 31 of the source region 24 and the drain region 25. It is considered that when a number of electrons are accumulated in the floating gate electrodes 17a and 17b, because of the electric field formed by these electrons, the electrons present in the source region 24 and the drain region 25 in the vicinity of the floating gate electrodes 17a and 17b decrease in number, thereby increasing the electric resistance in these regions. Data can be identified based on the level of the drain current, since the level of the drain current varies depending upon the level of the parasitic resistance 31 of the source region 24 and the drain region 25.

In order to practically read data, it is considered that the drain current under the condition that data is written should have a level of 80% or less that of the drain current under the condition that data is not written. In addition, in order to read data without error, it is preferred that the drain current under the condition that data is written has a level of 70% or less that of the drain current under the condition that data is not written.

In order to greatly vary the drain current in accordance with the accumulation or non-accumulation of electrons in the floating gate electrodes 17a and 17b, for example, the gate length of the floating gate electrodes 17a and 17b is made larger, and the thickness of the first and second portions 13a and 13b is made smaller.

Next, the erase operation of the memory cell will be described.

Electric potentials of −10 volts, 0 volt and 0 volt are respectively applied to the control gate electrode 14, the source region 24 and the drain region 25. The electric potentials of the floating gate electrodes 17a and 17b are sufficiently decreased due to the capacitive coupling between the control gate electrode 14 and the floating gate electrodes 17a and 17b. As a result, as shown in FIG. 2(c), the electrons accumulated in the floating gate electrodes 17a and 17b transfer to the source region 24 and the drain region 25 therefrom.

Figure 8:
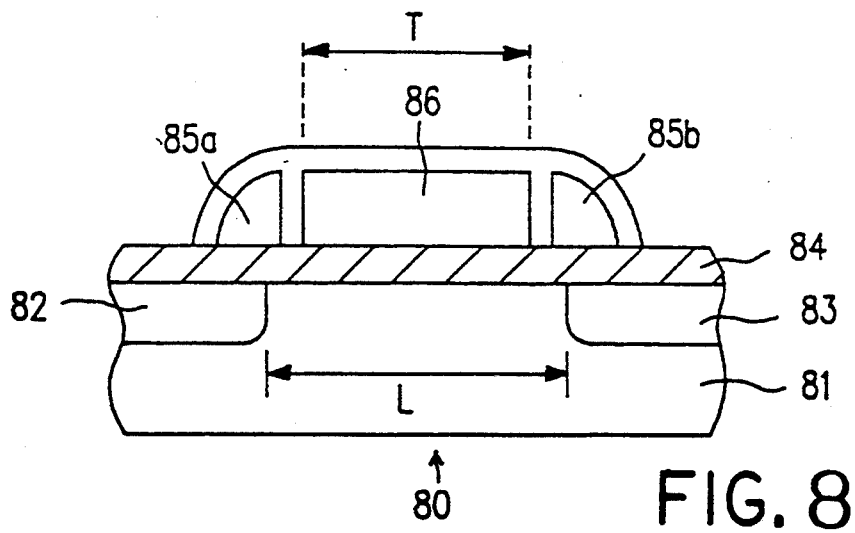
FIG. 8 is a cross-sectional view showing an example of a conventional non-volatile memory cell of a side wall accumulation type.

The memory cell of the present example is different from that of FIG. 8 because of the following points:

(1) In the memory cell of FIG. 8, the electrons are injected from the channel region into the floating gate electrode 85b. Because of this, a part of the floating gate electrode 85b should cover a part of the channel region. On the other hand, in the memory cell of the present example, the electrons are injected from the source region 24 and the drain region 25 into the floating gate electrodes 17a and 17b, respectively. Because of this, it is not required that a part of the floating gate electrodes 17a and 17b cover a part of the channel region.

(2) In the memory cell of FIG. 8, hot electrons should be generated at the end of the channel region for the purpose of writing data. Part of the generated hot electrons are injected into the floating gate electrode 85b; however, part of the remaining hot electrons tend to be trapped in the gate insulating film 84 above the channel region. On the other hand, in the memory cell of the present example, the electrons are injected from the source region 24 and the drain region 25 into the floating gate electrodes 17a and 17b because of an FN conduction mechanism. Therefore, the generation of hot electrons is not required for the purpose of writing data. Thus, according to the present invention, there is little possibility that the hot electrons are trapped in the third portion 13c and that the reliability of the memory cell becomes degraded.

(3) In the memory cell of FIG. 8, the electrons accumulated in the floating gate electrodes 85a and 85b cannot be electrically removed, so that data stored in the memory cell cannot be electrically erased. In the memory cell of the present example, the electrons are injected taking advantage of the FN conduction mechanism, so that data stored in the memory cell can be electrically erased.

Next, a method for fabricating the above-mentioned memory cell will be described with reference to FIGS. 1(a) to 1(c).

A relatively thick oxide film (thickness: 20 nm) to be the third portion 13c is formed on the silicon substrate 11. Then, a polycrystalline silicon film is formed on the oxide film by a CVD method. The polycrystalline silicon film and the underlying oxide film are patterned to a predetermined wiring pattern by photolithography and etching to form the control gate electrode 14. In this way, the remaining thick oxide film (i.e., the third portion 13c) and the control gate electrode 14 cover and the channel region in the silicon substrate 11, as shown in FIG. 1(a).

Then, As ions are implanted into the surface of the silicon substrate 11 using the control gate electrode 14 as a mask, and high concentration impurity diffusion regions (i.e., the source region 24 and the drain region 25) are formed in a self-alignment with the control gate electrode 14.

An insulating film 12 (thickness: 15 nm) which separates the floating gate electrode 17a from the control gate electrode 14 and the floating gate electrode 17b from the control gate electrode 14 is formed on both side faces and an upper face of the control gate electrode 14. After this, thin oxide films (thickness: 10 nm) are formed on the exposed surfaces of the silicon substrate 11. These thin oxide films correspond to the first portion 13a and the second portion 13b.

Then, polycrystalline silicon is deposited over the entire surface of the silicon substrate 11 by a CVD method so as to cover the thin oxide films. The polycrystalline silicon is etched from the above by an etching technique with high anisotrophy without using a mask. In this way, the polycrystalline silicon deposited on the regions other than those on both sides of the control gate electrode 14 is removed, thereby forming the floating gate electrodes 17a and 17b of a side wall type on both sides of the control gate electrode 14 (FIG. 1(b)).

Thereafter, the interlevel insulator 18 is formed, the contact holes are formed in the interlevel insulator 18, and the source electrode 20S and the drain electrode 20D are formed by an ordinary technique. Thus, a structure as shown in FIG. 1(c) is obtained.

Figure 9A:
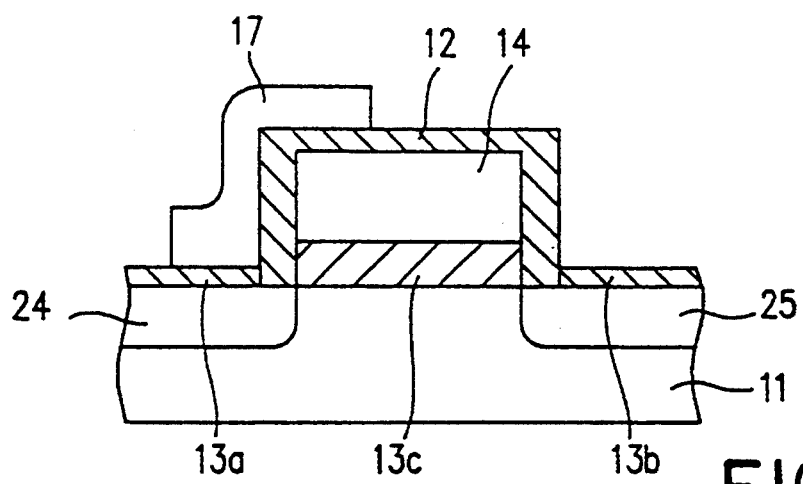
FIGS. 9(a) and 9(b) are cross-sectional views of a modified non-volatile memory cell shown in FIG. 1(c).

In the present example, as the floating gate electrodes for accumulating electrons, a pair of floating gate electrodes 17a and 17b of a side wall type are provided on both sides of the control gate electrode 14. Alternatively, as shown in FIG. 9(a), one floating gate electrode 17 can be provided on one side of the control gate electrode 14 (i.e., on the source region 24 or on the drain region 25). The presence of the electrons accumulated in the floating gate electrode 17 varies the resistance of the impurity diffusion layer positioned right under the floating gate electrode 17, whereby the value of the drain current for reading data can be varied at a detectable level. In a non-volatile memory cell accumulating electrons in one floating gate electrode 17, it is preferred that the voltage to be applied to the control gate electrode is increased or the facing area of the floating gate electrode 17 and a diffusion layer is enlarged so that the source resistance or the drain resistance is varied within a detectable range by one floating gate electrode 17.

Figure 9B:
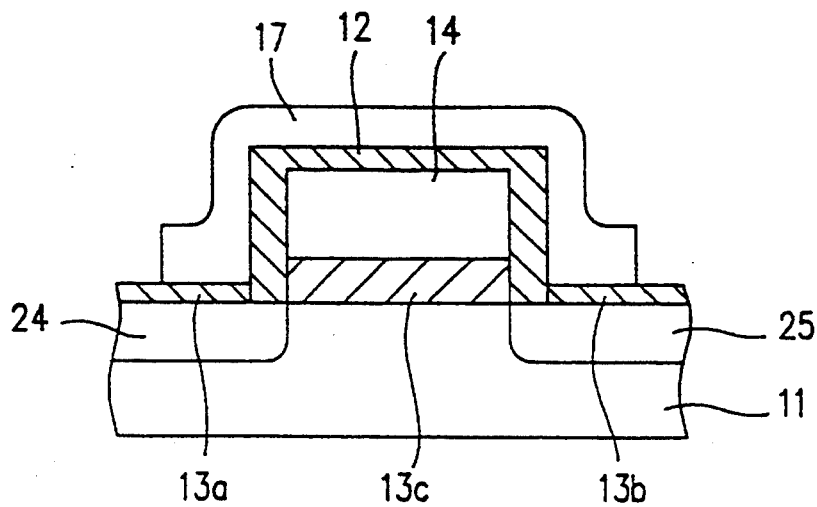

The configuration of the floating gate electrode 17 is not limited to a side wall. As shown in FIG. 9(a), the floating gate electrode 17 can be formed so as to cover a part of the upper surface of the control gate electrode 14. Alternatively, as shown in FIG. 9(b), the floating gate electrodes 17a and 17b are connected to each other on the upper surface of the control gate electrode 14 so as to control the diffusion layer resistance of both of the source region 24 and the drain region 25.

EXAMPLE 2

Figure 4A:
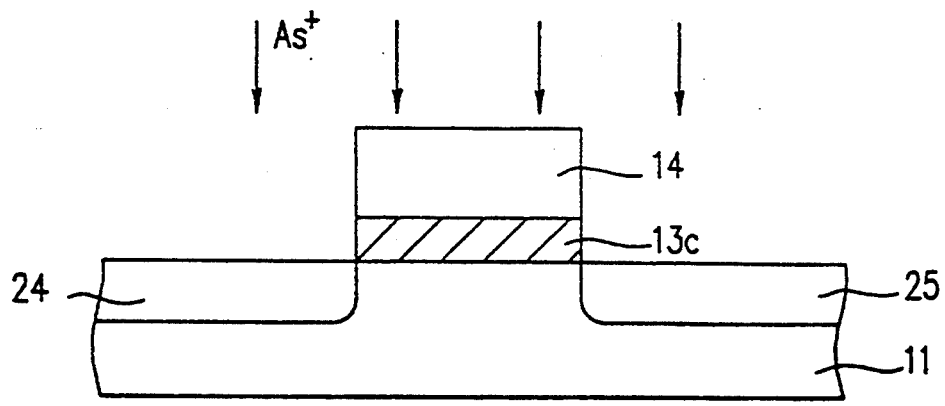
FIGS. 4(a) to 4(c) are cross-sectional views of another non-volatile memory cell according to the present invention, showing the steps of the fabrication thereof.
Figure 4B:
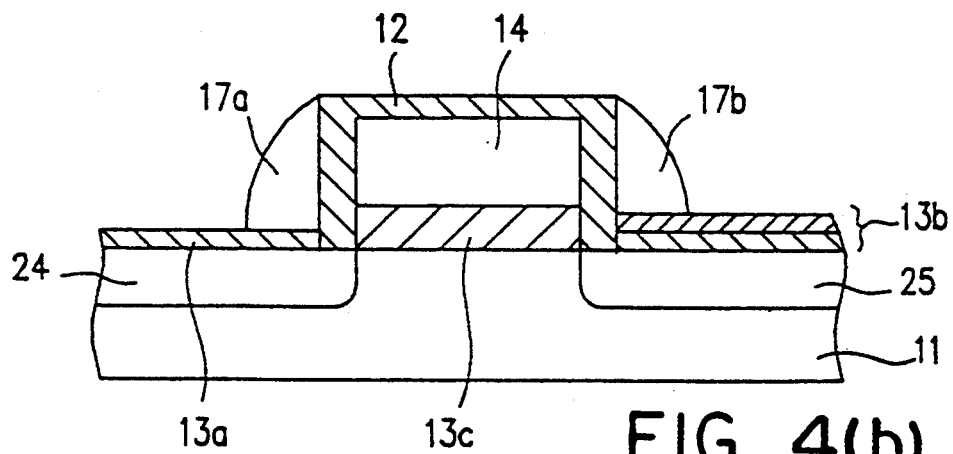
Figure 4C:
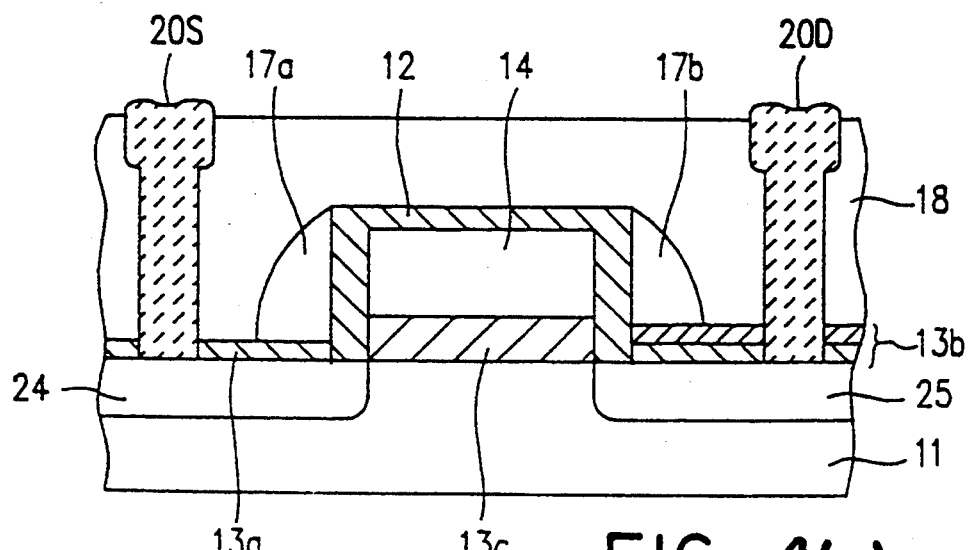

Hereinafter, another non-volatile memory cell of a side wall accumulation type according to the present invention will be described with reference to FIGS. 4(a) to 4(c). FIG. 4(c) is a cross-sectional view of the memory cell. In this figure, the same reference numerals as those in the memory cell of FIG. 1(c) denote the same components. The principal difference between the memory cell of FIG. 1(c) and that of Example 2 lies in the structure of a gate insulating film.

Hereinafter, the present example will be shown by mainly describing the structure of a gate insulating film.

The gate insulating film of the present example also includes the first portion 13a, the second portion 13b, and the third portion 13c. The first portion 13a has a thickness of 10 nm and covers the source region 24, the second portion 13b has a thickness of 15 nm and covers the drain region 25, and the third portion 13c has a thickness of 20 nm and covers the channel region. The first portion 13a and the second portion 13b are thinner than the third portion 13c. In this respect, the present example has the same structure as that of Example 1. However, in the present example, the first portion 13a is thinner than the second portion 13b, which is a different structure from that of Example 1. In the present example, the second portion 13b has a two-layered structure.

Hereinafter, the operation of the memory cell of the present example will be described with reference to FIGS. 5(a) to 5(d).

First, the write operation of the memory cell will be described.

Figure 5A:
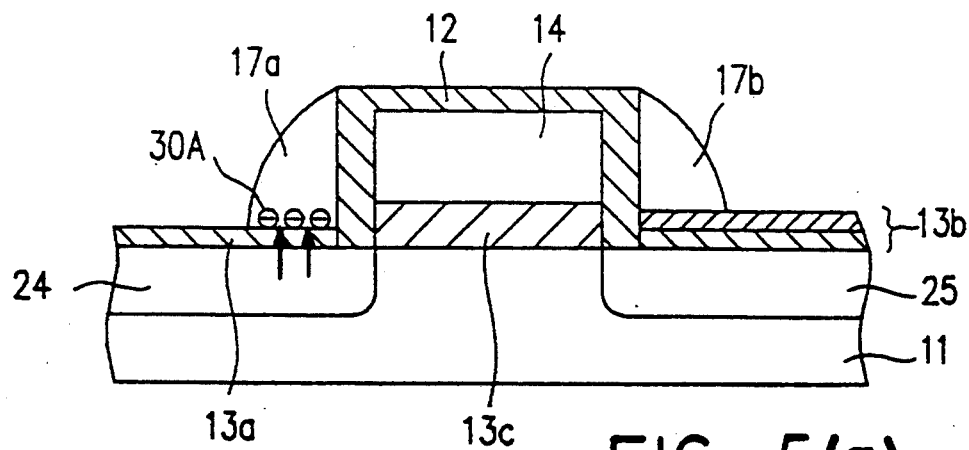
FIGS. 5(a) to 5(d) illustrate the operation of the memory cell shown in FIG. 4(c).

Electric potentials of 10 volts, 0 volt and 0 volt are respectively applied to the control gate electrode 14, the source region 24 (source electrode 20S) and the drain region 25 (drain electrode 20D). The electric potentials of the floating gate electrodes 17a and 17b increase due to the capacitive coupling between the control gate electrode 14 and the floating gate electrodes 17a and 17b. More specifically, when the electric potential of the control gate electrode 14 is increased from 0 volt to 10 volts within about 1 to 2 nonoseconds, the electric potentials of the floating gate electrodes 17a and 17b overshoot to temporarily increase to about 15 volts, for example. As a result, as shown in FIG. 5(a), the electrons in the source region 24 pass through the first portion 13a because of the tunnel effect to be injected into the floating gate electrode 17a. At this time, an FN current does not flow through the second portion 13b. This is because the thickness of the second portion 13b is set so that the FN current hardly flows therethrough even though the electric potential of 10 volts is applied to the control gate electrode 14. Even though the electric potential of the control gate electrode 14 is decreased below 10 volts after the electrons are injected into the floating gate electrode 17a, since the floating gate electrode 17a is covered with the insulating films, the electrons are retained in the floating gate electrode 17a.

Next, the case where electrons are injected into the floating gate electrodes 17a and 17b will be described.

Figure 5B:
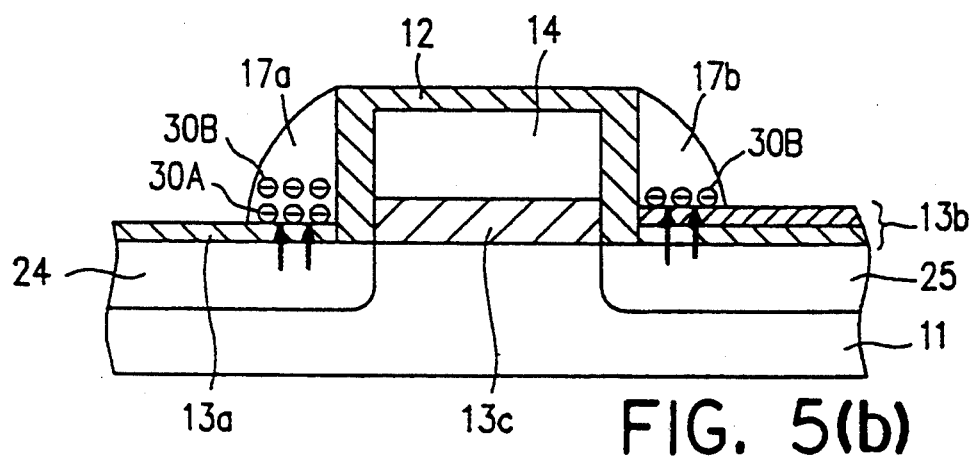

Electric potentials of 15 volts, 0 volt and 0 volt are respectively applied to the control gate electrode 14, the source region 24 and the drain region 25. The electric potentials of the floating gate electrodes 17a and 17b with respect to the source region 24 and the drain region 25 increase to a level required for generating the FN current. More specifically, when the electric potential of the control gate electrode 14 is increased from 0 volt to 15 volts within about 1 to 2 nanoseconds, the electric potentials of the floating gate electrodes 17a and 17b overshoot to temporarily increase to about 20 volts, for example. As a result, as shown in FIG. 5(b), the electrons in the source region 24 and the drain region 25 pass through the first and second portions 13a and 13b because of the tunnel effect to be injected into the floating gate electrodes 17a and 17b. Even though the electric potential of the control gate electrode 14 is decreased below 15 volts after the electrons are injected into the floating gate electrodes 17a and 17b, since the floating gate electrodes 17a and 17b are covered with the insulating films, the electrons are retained therein.

Figure 6:
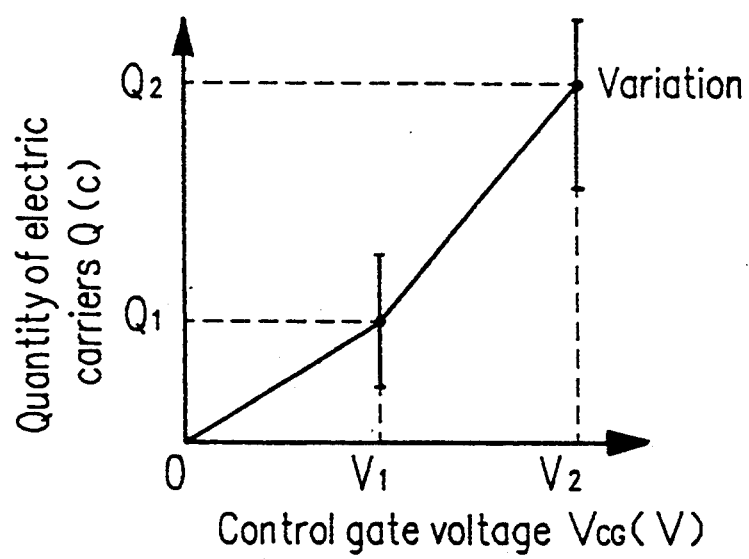
FIG. 6 is a graph showing the relationship between the quantity of electric carriers Q(c) to be injected into the floating gate electrode of the memory cell shown in FIG. 4(c) and the control gate voltage $V_{CG}$ to be applied to the control gate electrode.

FIG. 6 shows the relationship between the quantity of electric carriers Q(c) accumulated in the floating gate electrodes 17a and 17b and the control gate voltage $V_{CG}$ to be applied to the control gate electrode 14. When the control gate voltage $V_{CG}$ is below a first voltage V1, the quantity of electric carriers Q(c) increases in proportion to the control gate voltage $V_{CG}$.

When the control gate voltage $V_{CG}$ is equal to the first voltage V1, the quantity of electric carriers Q(c) is equal to Q1. On the other hand, when the control gate voltage $V_{CG}$ is between the first voltage V1 and a second voltage V2, the quantity of the electric carriers Q(c) increases in proportion to the control gate voltage $V_{CG}$, and when the control gate voltage $V_{CG}$ is equal to the second voltage V2, the quantity of electric carriers Q(c) is equal to Q2. In particular, when the control gate voltage $V_{CG}$ is between the first voltage V1 and the second voltage V2, the quantity of electric carriers Q(c) steeply increases in proportion to the control gate voltage $V_{CG}$. The reason for this is as follows.

When the control gate voltage $V_{CG}$ is less than V1, the electrons are injected into only one of the floating gate electrodes 17a and 17b. When the control gate voltage $V_{CG}$ is V1 or more, the electrons are injected into both of the floating gate electrodes 17a and 17b.

As described above, in the memory cell of the present example, either one of the floating gate electrodes 17a and 17b is accumulated with electrons, both of the floating gate electrodes 17a and 17b are accumulated with the electrons, or the floating gate electrodes 17a and 17b are not accumulated with the electrons. Thus, in the present example, logic data of three values: "1", "1", and "2" can be written in each memory cell. In order to inject the electrons into both of the floating gate electrodes 17a and 17b or either one of them, it is required to adjust the thickness of the first portion 13a, that of the second portion 13b, and the level of an electric potential (the first voltage V1 and the second voltage V2) to be applied to the control gate electrode 14. More specifically, the first and second voltages V1 and V2 and the thickness of the first and second portions 13a and 13b are determined so that at the first voltage V1 (e.g., 10 volts), the electrons are injected into one of the floating gate electrodes (e.g., 17a), and at the second voltage V2 (e.g., 15 volts), the electrons are injected into both of the floating gate electrodes 17a and 17b.

Next, the read operation of the memory cell will be described.

Figure 5C:
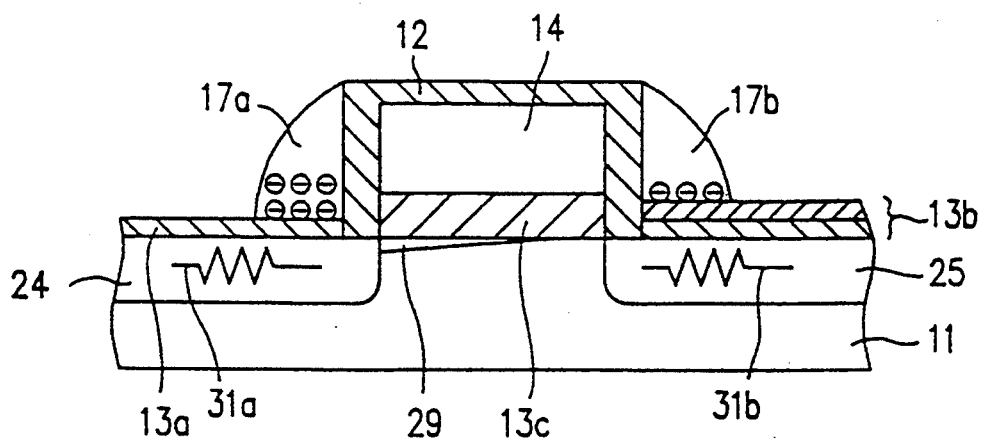

The read operation of the memory cell of the present example is conducted substantially in the same way as in Example 1. Namely, electric potentials of 5 volts, 0 volt and 1 volt are respectively applied to the control gate electrode 14, the source region 24 and the drain region 25 to form the conductive channel 29, as shown in FIG. 5(c). The level of a current flowing between the source region 24 and the drain region 25 (i.e., drain current) is detected. The level of the drain current varies depending upon the level of parasitic resistance 31a and 31b shown in FIG. 5(c). More specifically, the drain current increases in the following order ((1) → (2) → (3)):

(1) The electrons are not accumulated in either of the floating gate electrodes 17a and 17b;

(2) The electrons are accumulated in one of the floating gate electrodes 17a and 17b; and (3) The electrons are accumulated in both of the floating gate electrodes 17a and 17b.

Figure 7:
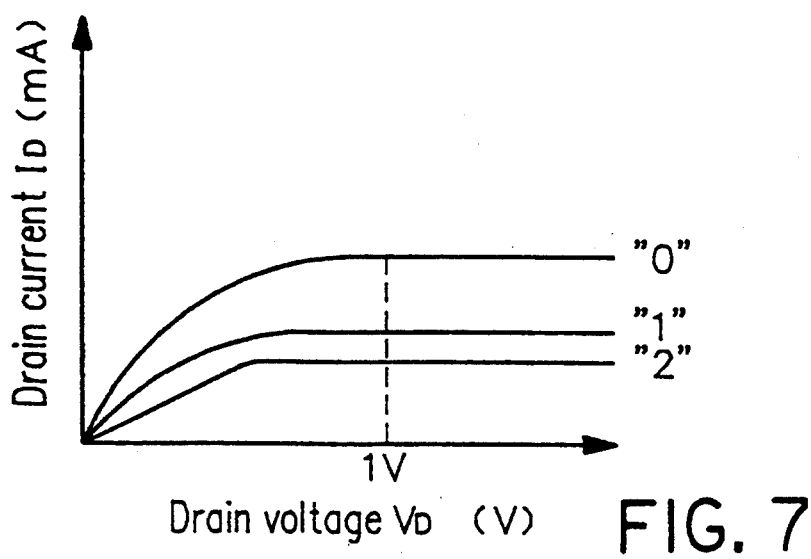
FIG. 7 is a graph showing the relationship between the drain current $I_D$ and the drain voltage $V_D$ in the memory cell shown in FIG. 4(c).

FIG. 7 shows the relationship between the drain current $I_D$ and the drain voltage $V_D$. As shown in FIG. 7, logic values: "0", "1" and "2" are identified based on the level of the drain current.

Figure 5D:
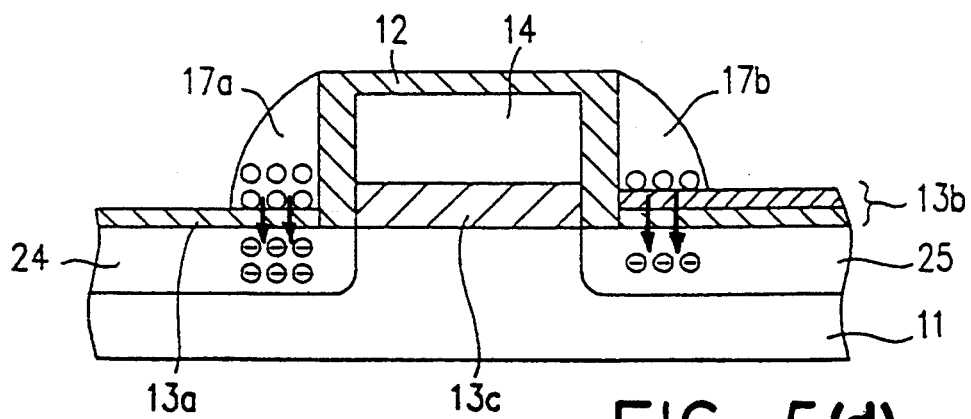

The erase operation in the present example, as shown in FIG. 5(d), is conducted substantially in the same way as in Example 1. In order that the electrons are discharged from both of the floating gate electrodes 17a, and 17b, an electric potential to be applied to the control gate electrode 14 is adjusted, for example, at −15 volts.

Next, a method for fabricating the above-mentioned memory cell will be described with reference to FIGS. 4(a) to 4(c).

A relatively thick oxide film (thickness: 20 nm) which is to be the third portion 13c is formed on the silicon substrate 11. Then, a polycrystalline silicon film is formed on the oxide film by a CVD method. It is preferred that this oxide film is formed by a thermal oxidation method, considering the reliability of the memory cell. The surface of the oxide film can be nitrided in order to further improve the reliability.

Then, the polycrystalline silicon film and the underlying oxide film are patterned to a predetermined wiring pattern to form the control gate electrode 14 by photolithography and etching. In this way, the thick oxide film (i.e., the third portion 13c) and the control gate electrode 14 cover the channel region of the silicon substrate 11, as shown in FIG. 4(a).

Then, As ions are implanted into the surface of the silicon substrate 11 using the control gate electrode 14 as a mask, and high concentration impurity diffusion regions (i.e., the source region 24 and the drain region 25) are formed in a self-alignment with the control gate electrode 14.

The insulating film 12 is formed on both side faces and an upper face of the control gate electrode 14. The insulating film 12 separates the floating gate electrode 17a from the control gate electrode 14 and the floating gate electrode 17b from the control gate electrode 14. After this, thin oxide films are formed on the exposed surfaces of the silicon substrate 11. These thin oxide films correspond to the first portion 13a and the second portion 13b.

Then, the thickness of the second portion 13b is made larger than that of the first portion 13a. There are the following methods for selectively making the thickness of the second portion 13b larger than that of the first portion 13a:

(1) A thin insulating film is formed on regions on the silicon substrate 11 (including the first portion 13a and the second portion 13b). Then, an etching mask is formed only on the second portion 13b. After this, the thin insulating film provided on the regions which are not covered with this etching mask is etched, whereby the thin insulating film can be retained only on the second portion 13b. As a result, the thickness of the second portion 13b becomes larger by the thickness of this thin insulating film than that of the first portion 13a.

(2) An oxidation barrier layer (e.g., a layer made of a silicon nitride film) is formed on regions on the silicon substrate 11 excluding the second portion 13b. Then, the layered structure thus obtained is subjected to thermal oxidation. Because of this thermal oxidation, a thermal oxide film is grown only on the second portion 13b. As a result, the thickness of the second portion 13b becomes larger by the thickness of this thermal oxide film than that of the first portion 13a.

After the thickness of the second portion 13b is made larger than that of the first portion 13a by either one of the above-mentioned methods, polycrystalline silicon is deposited over the entire surface of the silicon substrate 11 by a CVD method so as to cover the first and second portions 13a and 13b. The polycrystalline silicon is etched from the above by an etching technique with high anisotropy without using a mask. In this way, the polycrystalline silicon deposited on the regions other than those on both sides of the control gate electrode 14 is removed, thereby forming the floating gate electrodes 17a and 17b of a side wall accumulation type on both sides of the control gate electrode 14 (FIG. 4(b)).

Thereafter, the interlevel insulator 18 is formed, the contact holes are formed in the interlevel insulator 18, and the source electrode 20S and the drain electrode 20D are formed by an ordinary technique. Thus, a structure as shown in FIG. 4(c) is obtained.

Example 3

Figure 10:
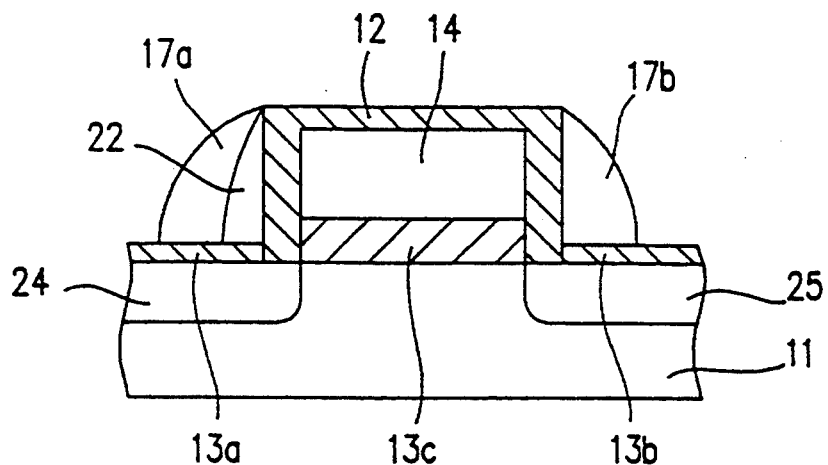
FIG. 10 is a cross-sectional view of another non-volatile memory cell according to the present invention.

Hereinafter, another non-volatile memory cell of a side wall accumulation type according to the present invention will be described with reference to FIG. 10. FIG. 10 is a cross-sectional view of the memory cell. In this figure, the same reference numerals as those in the memory cell of FIG. 1(c) denote the same components. The principal difference between the memory cell of FIG. 1(c) and that of Example 3 lies in the structure of an insulating film provided between the control gate electrode and the floating gate electrodes.

Hereinafter, the present example will be shown by mainly describing the structure of an insulating film.

The thickness of the insulating film provided between the first floating gate electrode 17a and the control gate electrode 14 is 17.5 nm. The thickness of the insulating film provided between the second floating gate electrode 17b and the control gate electrode 14 is 15 nm. The insulating film provided between the first floating gate electrode 17a and the control gate electrode 14 has a two-layered structure. The second layer of the two-layered structure corresponds to an insulating side wall 22 having a thickness of 2.5 nm, the second layer being provided on the left side of the control gate electrode 14. In order to form the insulating side wall 22 only on the left side of the control gate electrode 14, insulating side walls are formed on both sides of the control gate electrode 14 by a known method, and then the side wall on the right side is selectively etched using a photoresist exposing only the side wall on the right side. For selective etching with good controllability, it is preferred that the insulating side wall 22 is made of a material different from that of the insulating film 12 directly covering the control gate electrode 14.

In the above-mentioned structure, the degree of the capacitive coupling between the first floating gate electrode 17a and the control gate electrode 14 is different from that of the capacitive coupling between the second floating gate electrode 17b and the control gate electrode 14. Thus, when a certain electric potential is applied to the control gate electrode 14, the electric potential of the first floating gate electrode 17a and that of the second floating gate electrode 17b become different. This means that the voltage applied to the first portion 13a is different from that applied to the second portion 13b during writing of data. In this respect, the present example is different from Example 1.

Next, the write operation of the non-volatile memory cell of the present example will be described.

Electric potentials of 10 volts, 0 volt and 0 volt are respectively applied to the control gate electrode 14, the source region 24 (source electrode 20S) and the drain region 25 (drain electrode 20D). The electric potentials of the floating gate electrodes 17a and 17b increase due to the capacitive coupling between the control gate electrode 14 and the floating gate electrodes 17a and 17b. As a result, the electrons in the source region 24 pass through the first portion 13a because of the tunnel effect to be injected into the floating gate electrode 17a. At this time, and FN current does not flow through the second portion 13b. The reason for this is as follows. Even though the electric potential of 10 volts is applied to the control gate electrode 14, the increase in electric potential of the second floating gate electrode 17b is relatively small, and hence the voltage at which the FN current hardly flows is applied to the second portion 13b. Even though the electric potential of the control gate electrode 14 is decreased below 10 volts after the electrons are injected into the floating gate electrode 17a, since the floating gate electrode 17a is covered with the insulating films, the electrons are retained in the floating gate electrode 17a.

Next, the case where electrons are injected into the floating gate electrodes 17a and 17b will be described.

Electric potentials of 15 volts, 0 volt and 0 volt are respectively applied to the control gate electrode 14, the source region 24 and the drain region 25. The electric potentials of the floating gate electrodes 17a and 17b with respect to the source region 24 and the drain region 25 increase to a level required for generating the FN current. As a result, the electrons in the source region 24 and the drain region 25 pass through the first and second portions 13a and 13b because of the tunnel effect to be injected into the floating gate electrodes 17a and 17b. Even though the electric potential of the control gate electrode 14 is decreased below 15 volts after the electrons are injected into the floating gate electrodes 17a and 17b, since the floating gate electrodes 17a and 17b are covered with the insulating films, the electrons are retained therein.

As described above, in the memory cell of the present example, either one of the floating gate electrodes 17a and 17b is accumulated with electrons, both of the floating gate electrodes 17a and 17b are accumulated with the electrons, or the floating gate electrodes 17a and 17b are not accumulated with the electrons. Thus, in the present example, logic data of three values: "0", "1", and "2" can be written in each memory cell.

The read operation of the present example is conducted substantially in the same way as in Example 2 (see FIGS. 5(a) to 5(d)). The erase operation of the present example is also conducted substantially in the same way as in Example 2.

The method for fabricating a memory cell of the present example is the same as that of Example 1 with the following alterations.

In the present example, the thickness of the insulating film on the source side is selectively made larger than that on the drain side before forming the first and second floating gate electrodes 17a and 17b.

As described above, in the present example, the thickness of the insulating film for capacitive coupling between the control gate electrode 14 and the first floating gate electrode 17a is made different from the thickness of the insulating film for capacitive coupling between the control gate electrode 14 and the second floating gate electrode 17b. Because of this, the degree of the capacitive coupling between the control gate electrode 14 and the first floating gate electrode 17a is made different from the degree of the capacitive coupling between the control gate electrode 14 and the second floating gate electrode 17b.

In order to realize such a difference in the degree of capacitive coupling, the dielectric constant of the insulating film on the right side of the control gate electrode 14 can be made different from that of the insulating film on the left side thereof, instead of making the thickness of the respective insulating films different.

Example 4

Figure 11A:
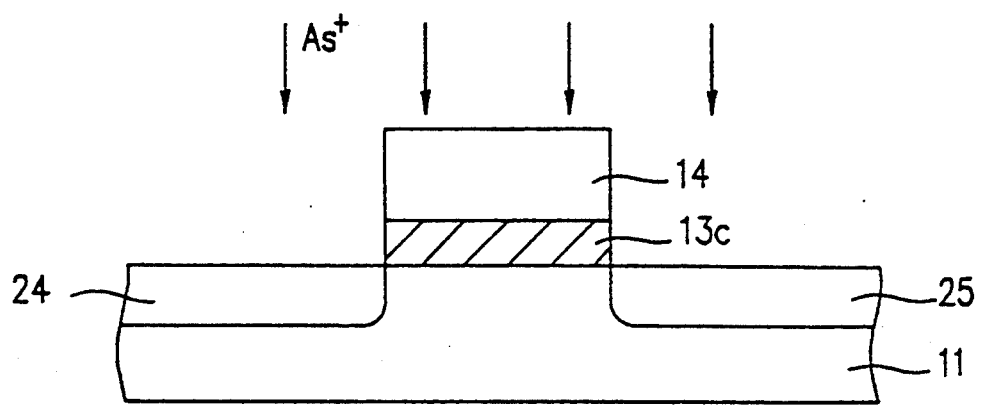
FIGS. 11(a) to 11(d) are cross-sectional views of another non-volatile memory cell according to the present invention, showing the steps of the fabrication thereof.
Figure 11B:
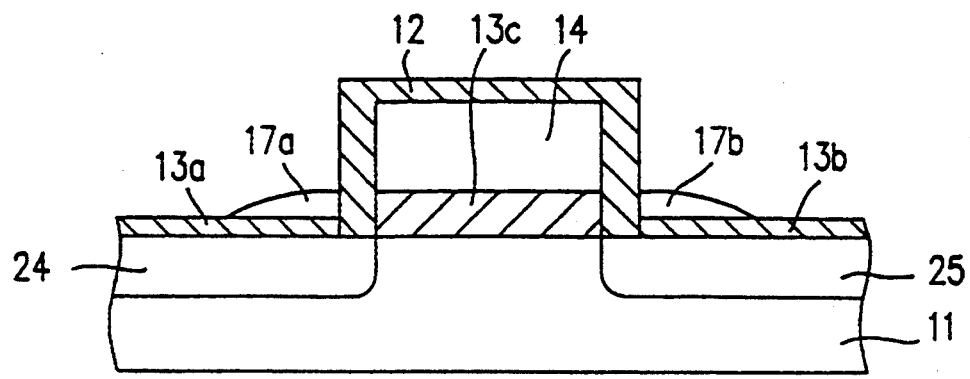
Figure 11C:
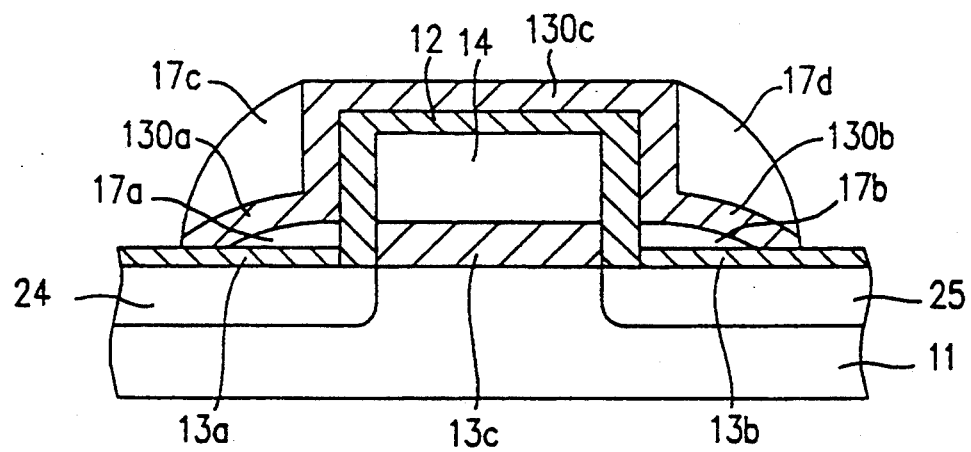
Figure 11D:
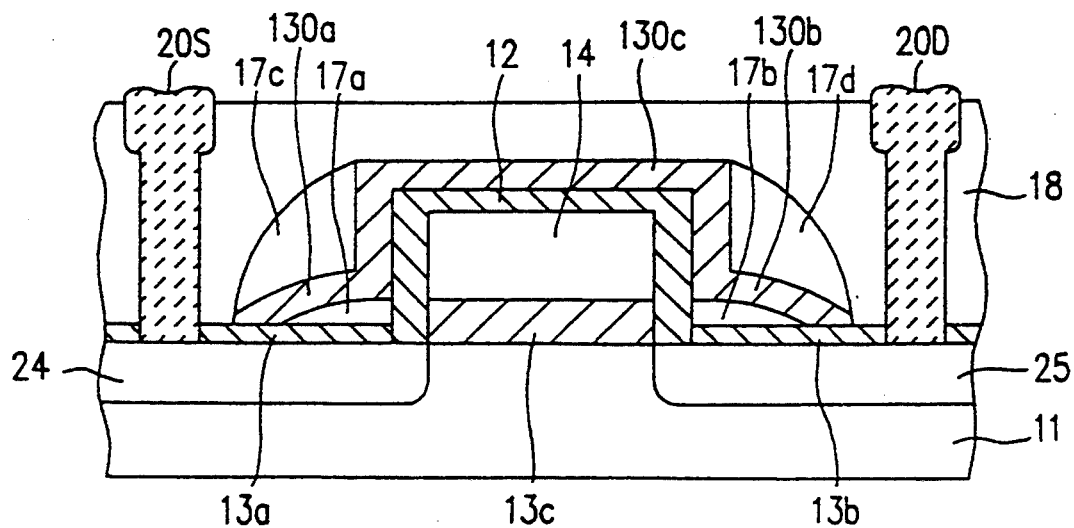

FIG. 11(d) is a cross-sectional view of another nonvolatile memory cell of a side wall accumulation type according to the present invention. The present invention will be described by way of an exemplary memory cell fabricated by using a CMOS process for fabricating an LSI with a minimum size of 0.5 to 1.0 μm.

This memory cell includes an n-type source region 24 and an n-type drain region 25 facing each other at a certain distance (about 0.25 μm) and a channel region positioned between the source region 24 and the drain region 25. The source region 24 and the drain region 25 are provided in the upper portion of a p-type silicon substrate 11. The source region 24 and the drain region 25 are typically an impurity diffusion region with a thickness of about 0.1 μm. The surface concentration of n-type impurities doped in the impurity diffusion regions is $10^{20}$ cm$^{-3}$ to $10^{21}$ cm$^{-3}$. In the silicon substrate 11, p-type impurities with a surface concentration of about $10^{17}$ cm$^{-3}$ are doped.

On the silicon substrate 11, a first gate insulating film is provided. The first gate insulating film includes a first portion 13a, a second portion 13b, and a third portion 13c. The first portion 13a has a thickness of 10 nm and covers the source region 24, the second portion 13b has a thickness of 10 nm and covers the drain region 25, and the third portion 13c has a thickness of 20 nm and covers the channel region. In the present example, the first portion 13a and the second portion 13b has the same thickness. It is required that the thickness of the first portion 13a and the second portion 13b is set so that FN current flows therethrough (i.e., about 5 nm or more).

A first floating gate electrode 17a is provided on the first portion 13a, and a second floating gate electrode 17b is provided on the second portion 13b. In addition, a control gate electrode 14 is provided on the third portion 13c. The control gate electrode 14 is electrically insulated from the first floating gate electrode 17a and the second floating gate electrode 17b by an insulating film 12. The control gate electrode 14 and the floating gate electrodes 17a and 17b are typically made of polycrystalline silicon, polycide, etc.

The gate length of the control gate electrode 14 of the present example (measured along the channel length direction) is about 0.25 μm, and the gate width thereof (measured along the direction vertical to the channel length direction) is about 2 μm. The gate length of the floating gate electrodes 17a and 17b is about 0.1 to 0.15 μm, and the gate width thereof is equal to that of the control gate electrode 14.

The memory cell of the present example further includes a second gate insulating film covering the first floating gate electrode 17a and the second floating gate electrode 17b. The second gate insulating film includes a first portion 130a and a second portion 130b. The first portion 130a has a thickness of 12.5 nm and covers the first floating gate electrode 17a and the second portion 130b has a thickness of 12.5 nm and covers the second floating gate electrode 17b. On the first portion 130a of the second gate insulating film, a third floating gate electrode 17c is provided. On the second portion 130b of the second gate insulating film, a fourth floating gate electrode 17d is provided.

Capacitive coupling is formed between the control gate electrode 14 and the third and fourth floating gate electrodes 17c and 17d through a third portion 130c of the second gate insulating film and the insulating film 12. The third and fourth floating gate electrodes 17c and 17d are typically made of polycrystalline silicon and the like.

The thickness of the third portion 13c is larger than the total thickness of the first portion 13a of the first gate insulating film and the first portion 130a of the second gate insulating film.

As shown in FIG. 11(d), the memory cell is covered with an interlevel insulator 18 formed on the silicon substrate 11. Contact holes are provided in the interlevel insulator 18 so as to reach the source region 24 and the drain region 25. In addition, above the silicon substrate 11, a source electrode 20S and a drain electrode 20D are provided. The source electrode 20S comes into contact with the source region 24 through the contact hole and the drain electrode 20D comes into contact with the drain region 25 through the contact hole.

Next, a method for fabricating the above-mentioned memory cell will be described with reference to FIGS. 11(a) to 11(d).

A relatively thick oxide film (thickness: 20 nm) to be the third portion 13c is formed on the silicon substrate 11. Then, a polycrystalline silicon film is formed on the oxide film by a CVD method. The polycrystalline silicon film and the underlying oxide film are patterned to a predetermined wiring pattern by photolithography and etching to form the control gate electrode 14. In this way, the remaining thick oxide film (i.e., the third portion 13c) and the control gate electrode 14 cover the channel region in the silicon substrate 11, as shown in FIG. 11(a).

Then, As ions are implanted into the surface of the silicon substrate 11 using the control gate electrode 14 as a mask, and high concentration impurity diffusion regions (i.e., the source region 24 and the drain region 25) are formed in a self-alignment with the control gate electrode 14.

An insulating film 12 (thickness: 15 nm) which separates the floating gate electrode 17a from the control gate electrode 14 and the floating gate electrode 17b from the control gate electrode 14 is formed on both side faces and an upper face of the control gate electrode 14. After this, thin oxide films (thickness: 10 nm) are formed on the exposed surfaces of the silicon substrate 11. These thin oxide films correspond to the first portion 13a and the second portion 13b.

Then, polycrystalline silicon is deposited over the entire surface of the silicon substrate 11 by a CVD method so as to cover the thin oxide films. The polycrystalline silicon is etched from the above by an etching technique with high anisotropy without using a mask. In this way, the polycrystalline silicon deposited on the regions other than those on both sides of the control gate electrode 14 is removed, thereby forming the floating gate electrodes 17a and 17b of a side wall type on both sides of the control gate electrode 14 (FIG. 11(b)).

Furthermore, an oxide film to be the second gate insulating film is formed on the resulting layered structure by a CVD method, and polycrystalline silicon is deposited over the entire surface of the layered structure by a CVD method. Then, the polycrystalline silicon is etched from the above by an etching technique with high anisotropy without using a mask. In this way, the polycrystalline silicon deposited on the regions other than those on both sides of the control gate electrode 14 is removed, thereby forming the floating gate electrode 17c and 17d of a side wall type on both sides of the control gate electrode 14 (FIG. 11(d)).

Thereafter, the interlevel insulator 18 is formed, the contact holes are formed in the interlevel insulator 18, and the source electrode 20S and the drain electrode 20D are formed by an ordinary technique. Thus, a structure as shown in FIG. 11(d) is obtained.

Hereinafter, the operation of the money cell will be described with reference to FIGS. 12(a) and 12(b).

First, a write operation will be described.

Electric potentials of 10 volts, 0 volts and 0 volt are respectively applied to the control gate electrode 14, the source region 24 (source electrode 20S) and the drain region 25 (drain electrode 20D). The electric potential of the control gate electrode 14 becomes 10 volts with respect to the source region 24 and the drain region 25. Because of the capacitive coupling of the floating gate electrodes 17a and 17b and the control gate electrode 14, the electric potentials of the floating gate electrodes 17a and 17b increase to a level required for generating an FN current. As a result, as shown in FIG. 12(a), electrons in the source region 24 and in the drain region 25 pass through the first and second portions 13a and 13b because of the tunnel effect and are injected into the floating gate electrodes 17a and 17b, respectively. After the electrons are injected into the floating gate electrodes 17a and 17b, even though the electric potential of the control gate electrode 14 is decreased below 10 volts, the electrons are retained in the floating gate electrodes 17a and 17b, because the floating gate electrodes 17a and 17b are respectively covered with the insulating films.

Among a plurality of memory cells, the control gate electrodes 14 of selected memory cells are applied with an electric potential of 10 volts and the control gate electrodes 14 of the other memory cells are applied with an electric potential of 0 volt. In this way, electrons are accumulated only in the floating gate electrodes 17a and 17b of the selected memory cells.

Electric potentials of 12.5 volts, 0 volt and 0 volt are respectively applied to the control gate electrode 14, the source region 24 (source electrode 20S) and the drain region 25 (drain electrode 20D). The electric potential of the control gate electrode 14 becomes 12.5 volts with respect to the source region 24 and the drain region 25. Because of the capacitive coupling of the floating gate electrodes 17a, 17b, 17c, and 17d and the control gate electrode 14, the electric potentials of the floating gate electrodes 17a, 17b, 17c, and 17d increase to a level required for generating an FN current in the first and second gate insulating films. As a result, as shown in FIG. 12(b), electrons in the source region 24 and in the drain region 25 pass through the first and second portions 13a and 13b because of the tunnel effect and are injected into the floating gate electrodes 17a and 17b, respectively. Furthermore, those injected electrodes pass through the first and second portions 130a and 130b because of the tunnel effect and are injected into the third and fourth floating gate electrodes 17c and 17d.

In the memory cell of the present example, the thickness of the third portion 13c of the first gate insulating film is set to be larger than the total thickness of the first portion 13a (or the second portion 13b) and the first portion 130a (or the second portion 130b).

After the electrons are injected into the floating gate electrodes 17a, 17b, 17c, and 17d, even though the electric potential of the control gate electrode 14 is decreased below 10 volts, the electrons are retained in the floating gate electrodes 17a, 17b, 17c, and 17d because the floating gate electrodes 17a, 17b, 17c, and 17d are respectively covered with the insulating films.

As described above, in the memory cell of the present example, a pair of floating gate electrodes 17a and 17b are accumulated with electrons, a pair of floating gate electrodes 17a and 17b and a pair of floating gate electrodes 17c and 17d are both accumulated with the electrons, or neither the floating gate electrodes 17a and 17b nor the floating gate electrodes 17c and 17d are accumulated with the electrons. Thus, in the present example, logic data of three values: "0", "1", and "2" can be written in each memory cell.

The relationship between the quantity of electric carriers and the applied voltage of the memory cell of the present example is similar to that shown in FIG. 6. The relationship between the drain current and the drain voltage is similar to that shown in FIG. 7. The read operation of the present example is conducted substantially in the same way as in the above-mentioned examples. The erase operation of the present example is also conducted substantially in the same way as in the above-mentioned examples.

Example 5

Figure 13:
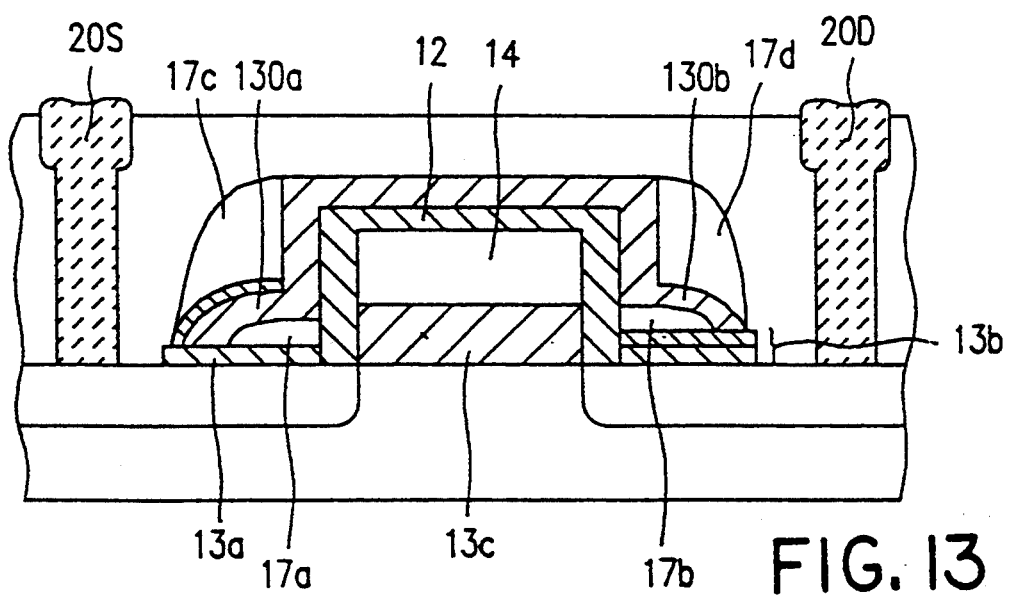
FIG. 13 is a cross-sectional view of another non-volatile memory cell according to the present invention, showing the steps of the fabrication thereof.

Hereinafter, another non-volatile memory cell of a side wall accumulation type according to the present invention will be described with reference to FIG. 13. FIG. 13 is a cross-sectional view of the memory cell. In this figure, the same reference numerals as those in the memory cell of FIG. 11(d) denote the same components. The principal difference between the memory cell of FIG. 11(d) and that of Example 5 lies in the structure of the first and second gate insulating films.

Hereinafter, the present example will be shown by mainly describing the structure of the first and second gate insulating films.

The first gate insulating film of the present example includes a first portion 13a, a second portion 13b, and a third portion 13c, in the same way as in the memory cell of FIG. 11(d). The first portion 13a has a thickness of 10 nm and covers the source region 24, the second portion 13b has a thickness of 12.5 nm and covers the drain region 25, and the third portion 13c has a thickness of 20 nm and covers the channel region. Both of the first and second portions 13a and 13b have a thickness smaller than that of the third portion 13c. In this respect, the present example has the same structure as that of Example 4. However, the memory cell of the present example is different from that of Example 4 in that the thickness of the first portion 13a is smaller than that of the second portion 13b. The second portion 13b of the first gate insulating film of the present example has a two-layered structure.

The second gate insulating film of the present example has a first portion 130a and a second portion 130b. The first portion 130a has a thickness of 17.5 nm and covers the first floating gate electrode 17a, and the second portion 130b has a thickness of 15 nm and covers the second floating gate electrode 17b. The thickness of the first portion 130a is larger than that of the second portion 130b. The first portion 130a has a two-layered structure.

Hereinafter, the operation of the memory cell of the present example will be described with reference to FIGS. 14(a), 14(b), and 15(a) to 15(c).

First, a write operation will be described.

Figure 14A:
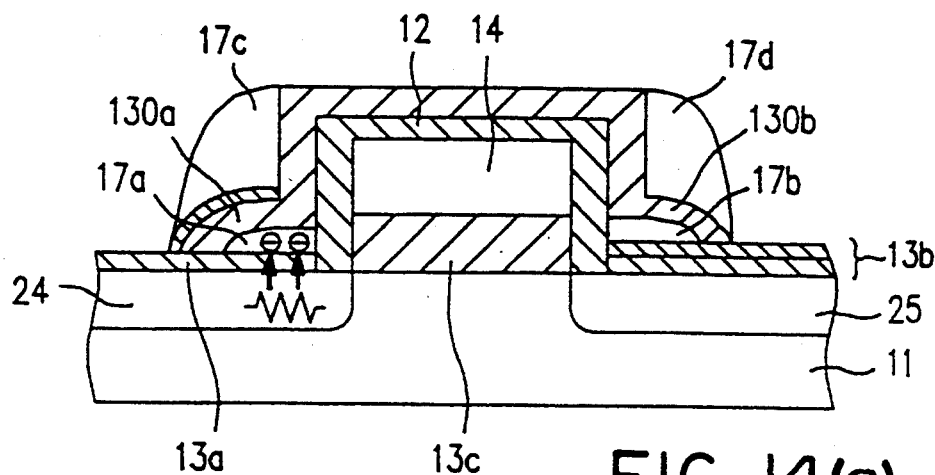
FIGS. 14(a) and 14(b) illustrate the operation of the memory cell shown in FIG. 13.

Electric potentials of 10 volts, 0 volt and 0 volt are respectively applied to the control gate electrode 14, the source region 24 (source electrode 20S) and the drain region 25 (drain electrode 20D). The electric potential of the control gate electrode 14 becomes 10 volts with respect to the source region 24 and the drain region 25. Because of the capacitive coupling of the floating gate electrodes 17a, 17b, 17c, and 17d and the control gate electrode 14, the electric potentials of the floating gate electrodes 17a, 17b, 17c, and 17d increase to a level required for generating an FN current. More specifically, when the electric potential of the control gate electrode 14 is increased from 0 volt to 10 volts within about 1 to 2 nanoseconds, the electric potentials of the floating gate electrodes 17a, 17b, 17c, and 17d overshoot to temporarily increase to about 15 volts, for example. As a result, as shown in FIG. 14(a), electrons in the source region 24 pass through the first portion 13a because of the tunnel effect and are injected into the floating gate electrode 17a. At this time, an FN current does not flow through the second portion 13b. This is because the thickness of the second portion 13b is set so that the FN current hardly flows therethrough even though the electric potential of 10 volts is applied to the control gate electrode 14. After the electrons are injected into the floating gate electrode 17a, even though the electric potential of the control gate electrode 14 is decreased below 10 volts, the electrons are retained in the floating gate electrode 17a, because the floating gate electrode 17a is covered with the insulating films.

Next, the case where electrons are injected into the floating gate electrodes 17a and 17b will be described.

Figure 14B:
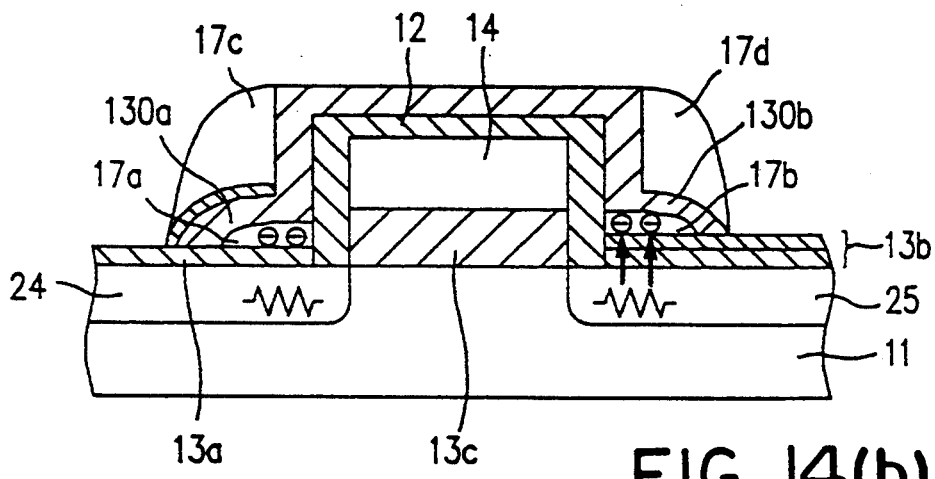

Electric potentials of 12.5 volts, 0 volt and 0 volt are respectively applied to the control gate electrode 14, the source region 24 and the drain region 25. The electric potentials of the floating gate electrodes 17a, 17b, 17c, and 17d with respect to the source region 24 and the drain region 25 increase to a level required for generating the FN current. More specifically, when the electric potential of the control gate electrode 14 is increased from 0 volt to 12.5 volts within about 1 to 2 nanoseconds, the electric potentials of the floating gate electrodes 17a, 17b, 17c, and 17d overshoot to temporarily increase to about 15 volts, for example. As a result, as shown in FIG. 14(b), electrons in the source region 24 and the drain region 25 pass through the first and second portions 13a and 13b because of the tunnel effect and are injected into the following gate electrodes 17a and 17b. At this time, the electrons are not injected into the floating gate electrodes 17c and 17d because of the presence of the second gate insulating film. After the electrons are injected into the floating gate electrodes 17a and 17b, even though the electric potential of the control gate electrode 14 is decreased below 12.5 volts, the electrons are retained in the floating gate electrodes 17a and 17b, because the floating gate electrodes 17a and 17b are respectively covered with the insulating films.

Figure 15A:
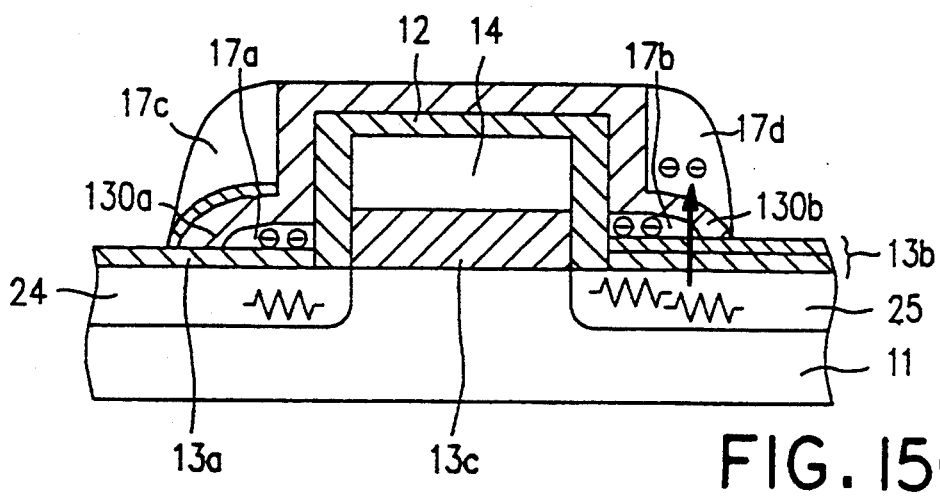
FIGS. 15(a) to 15(c) illustrate the operation of the memory cell shown in FIG. 13.

Electric potentials of 15 volts, 0 volt and 0 volt are respectively applied to the control gate electrode 14, the source region 24 (source electrode 20S) and the drain region 25 (drain electrode 20D). The electric potential of the control gate electrode 14 becomes 15 volts with respect to the source region 24 and the drain region 25. Because of the capacitive coupling of the floating gate electrodes 17c and 17d and the control gate electrode 14, the electric potentials of the floating gate electrodes 17c and 17d increase to a level required for generating an FN current. More specifically, when the electric potential of the control gate electrode 14 is increased from 0 volt to 15 volts within about 1 to 2 nanoseconds, the electric potentials of the floating gate electrodes 17c and 17d overshoot to temporarily increase to about 17.5 volts, for example. As a result, as shown in FIG. 15(a), electrons in the source region 24 pass through the first portion 13a because of the tunnel effect and are injected into the floating gate electrode 17a. Simultaneously, electrons in the drain region 25 pass through the second portions 13b and 130b because of the tunnel effect and are injected into the floating gate electrodes 17b and 17d. At this time, an FN current does not flow through the first portion 130a. This is because the thickness of the first portion 130a is set so that the FN current hardly flows therethrough even though the electric potential of 15 volts is applied to the control gate electrode 14. After the electrons are injected into the floating gate electrodes 17a, 17b, and 17d, even though the electric potential of the control gate electrode 14 is decreased below 15 volts, the electrons are retained in the floating gate electrodes 17a, 17b, and 17d because the floating gate electrodes 17a, 17b, and 17d are covered with the insulating films.

Next, the case where electrons are injected into the floating gate electrodes 17a, 17b, 17c, and 17d will be described.

Figure 15B:
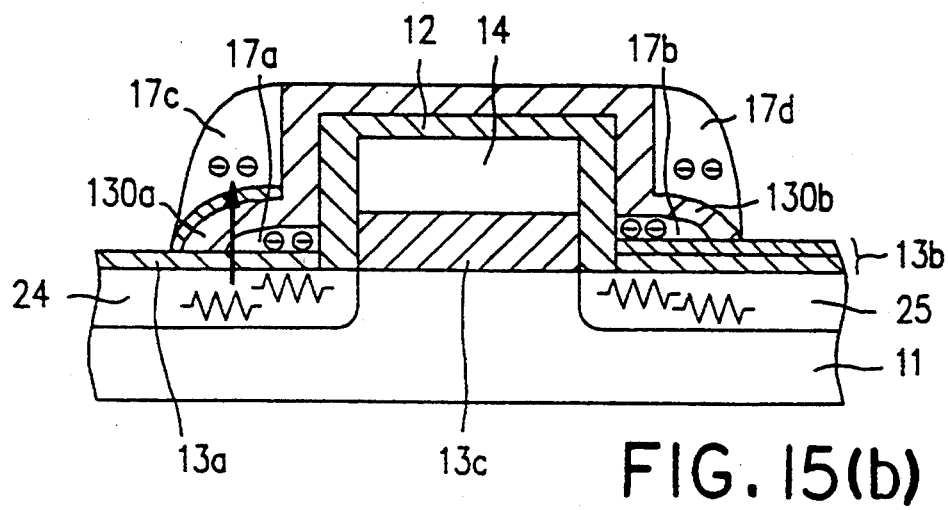

Electric potentials of 17.5 volts, 0 volt and 0 volt are respectively applied to the control gate electrode 14, the source region 24 and the drain region 25. The electric potentials of the floating gate electrodes 17a, 17b, 17c, and 17d with respect to the source region 24 and the drain region 25 increase to a level required for generating the FN current. More specifically, when the electric potential of the control gate electrode 14 is increased from 0 volt to 17.5 volts within about 1 to 2 nanoseconds, the electric potentials of the floating gate electrodes 17a, 17b, 17c, and 17d overshoot to temporarily increase to about 20 volts, for example. As a result, as shown in FIG. 15(b), electrons in the source region 24 and the drain region 25 pass through the first and second gate insulating films because of the tunnel effect and are injected into the floating gate electrodes 17a, 17b, 17c, and 17d. After the electrons are injected into the floating gate electrodes 17a, 17b, 17c, and 17d, even though the electric potential of the control gate electrode 14 is decreased below 20 volts, the electrons are retained in the floating gate electrodes 17a, 17b, 17c, and 17d because the floating gate electrodes 17a, 17b, 17c, and 17d are respectively covered with the insulating films.

Figure 16:
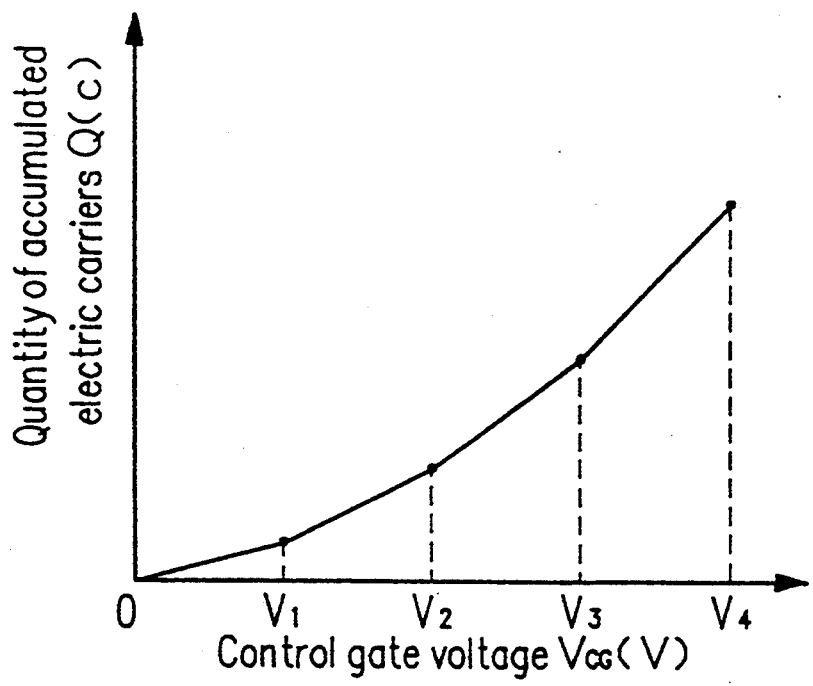
FIG. 16 is a graph showing the relationship between the quantity of electric carriers Q(c) to be injected into the floating gate electrode of the memory cell shown in FIG. 13 and the control gate voltage $V_{CG}$ to be applied to the control gate electrode.
Figure 17:
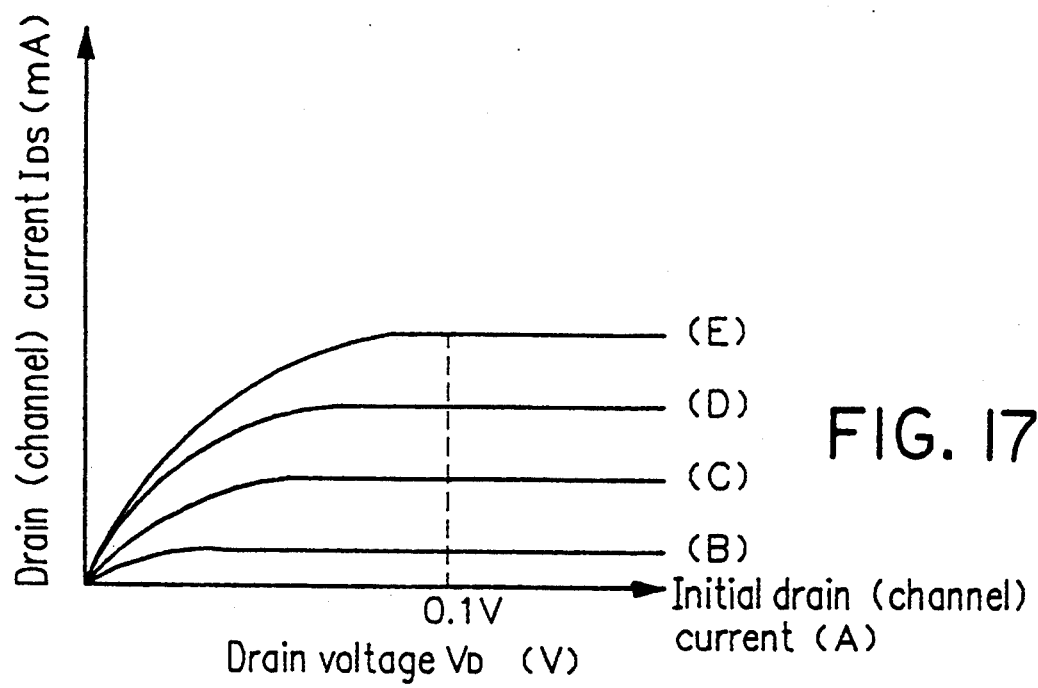
FIG. 17 is a graph showing the relationship between the drain current $I_D$ and the drain voltage $V_D$ in the memory cell shown in FIG. 13.

FIGS. 16 and 17 are graphs of the present example, respectively corresponding to FIGS. 6 and 7. As shown in FIGS. 16 and 17, in the memory cell of the present example, data of five values can be stored.

Figure 15C:
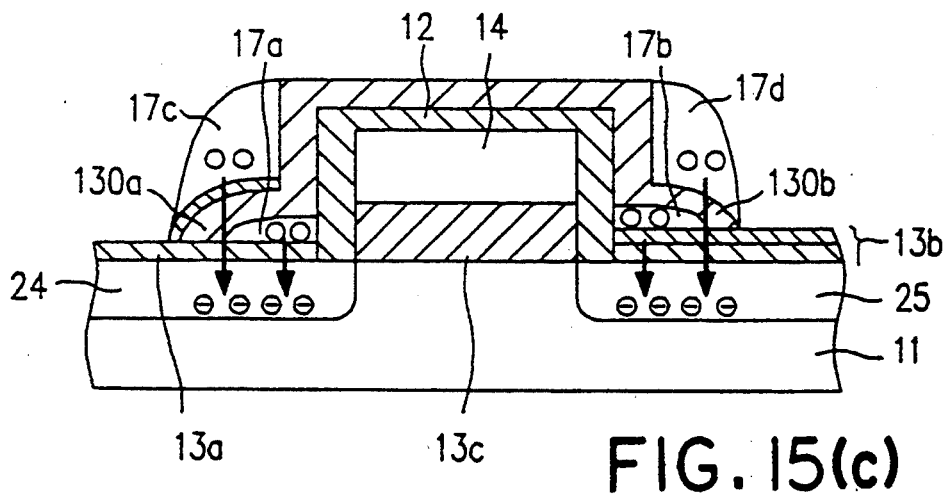

The erase operation of the present example is conducted substantially in the same way as in that of the above-mentioned examples (FIG. 15(c)).

Figure 12A:
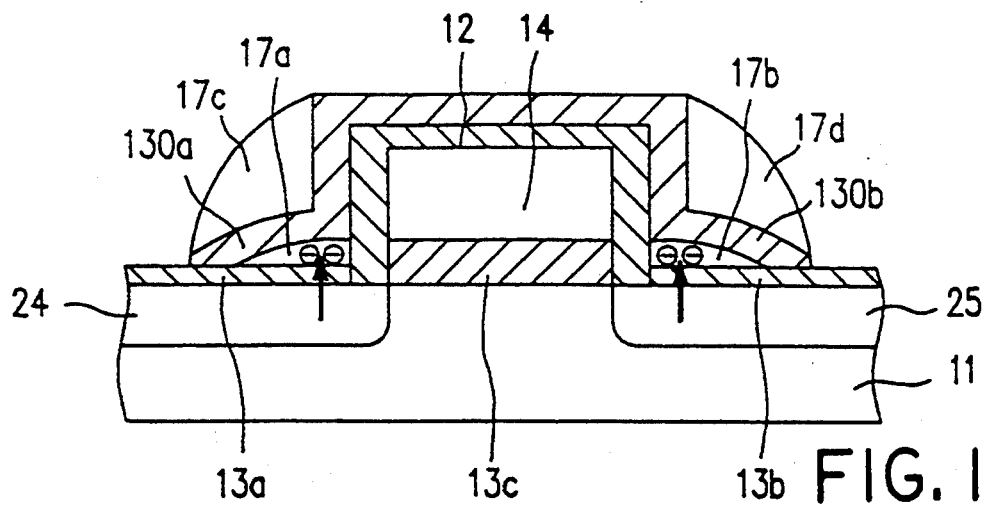
FIGS. 12(a) and 12(b) illustrate the operation of the memory cell shown in FIG. 11(d).
Figure 12B:
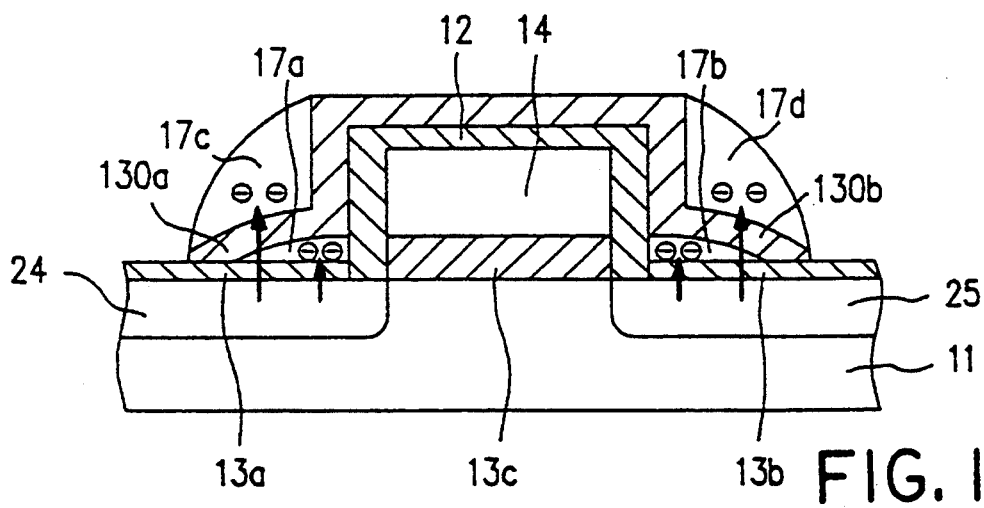

The method for fabricating the memory cell of the present example is different from that shown in FIGS. 12(a) and 12(b) in that the step of forming the first and second gate insulating films of the present example include the step of selectively making the thickness of the first and second portions larger or smaller.

Example 6

Figure 18A:
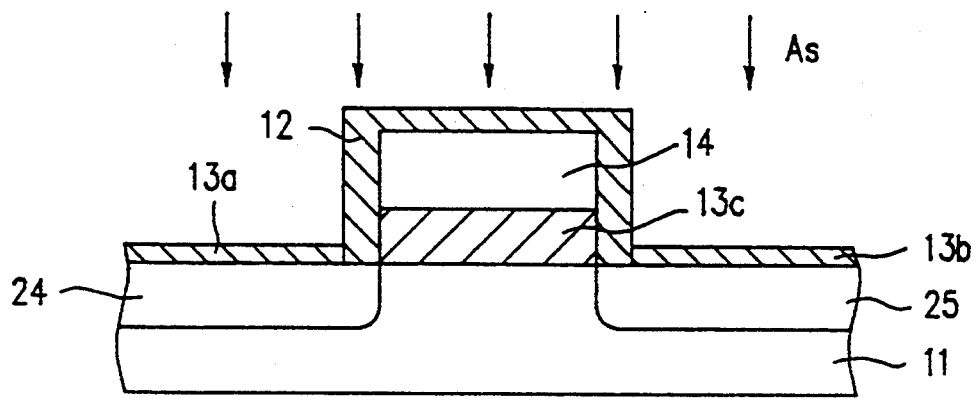
FIGS. 18(a) to 18(d) are cross-sectional views of another non-volatile memory cell according to the present invention, showing the steps of the fabrication thereof.
Figure 18B:
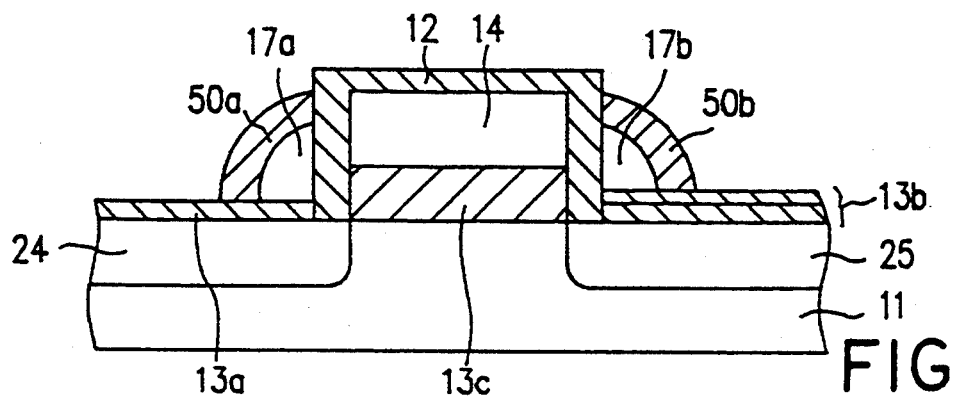
Figure 18C:
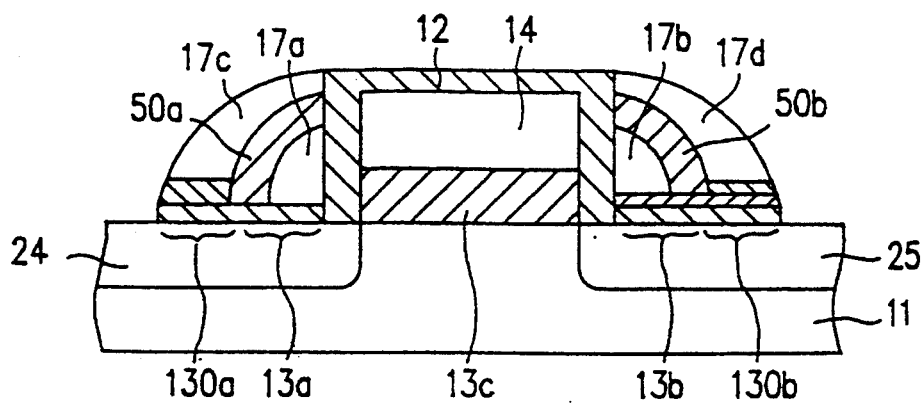
Figure 18D:
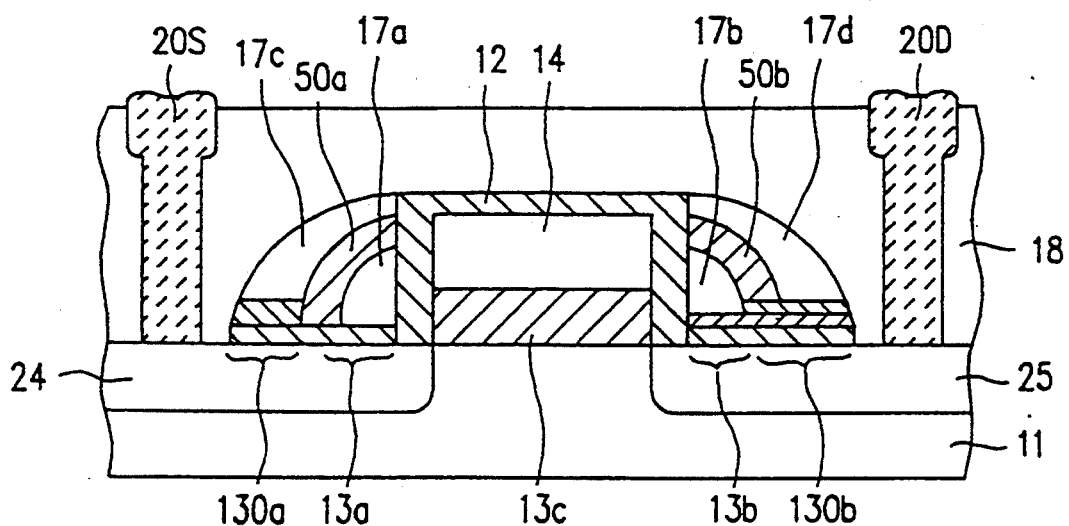

FIG. 18(d) is a cross-sectional view of another nonvolatile memory cell of a side wall accumulation type according to the present invention. The present invention will be described by way of an exemplary memory cell fabricated by using a CMOS process for fabricating an LSI with a minimum size of 0.5 to 1.0 μm.

This memory cell includes an n-type source region 24 and an n-type drain region 25 facing each other at a certain distance (about 0.25 μm) and a channel region positioned between the source region 24 and the drain region 25. The source region 24 and the drain region 25 are provided in the upper portion of a p-type silicon substrate 11. The source region 24 and the drain region 25 are typically an impurity diffusion region with a thickness of about 0.1 μm. The surface concentration of n-type impurities doped in the impurity diffusion regions is $10^{20}$ cm$^{-3}$ to $10^{21}$ cm$^{-3}$. In the silicon substrate 11, p-type impurities with a surface concentration of about $10^{17}$ cm$^{-3}$ are doped.

On the silicon substrate 11, a first gate insulating film is provided. The first gate insulating film includes a first portion 13a, a second portion 13b, and a third portion 13c. The first portion 13a has a thickness of 10 nm and covers one part of the source region 24, the second portion 13b has a thickness of 10 nm and covers one part of the drain region 25, and the third portion 13c has a thickness of 20 nm and covers the channel region.

Furthermore, on the silicon substrate 11, a second gate insulating film is provided. The second gate insulating film includes a first portion 130a and a second portion 130b. The first portion 130a has a thickness of 15 nm and covers another part of the source region 24 and the second portion 130b has a thickness of 17.5 nm and covers another part of the drain region 25.

In the present example, the thickness of the first portion 13a is smaller than that of the second portion 13b (two-layered structure). The thickness of the first portion 130a (two-layered structure) is smaller than that of the second portion 130b (three-layered structure). The purpose for this structure is to make the memory cell store data of five values. For storing data of three values, the first and second portions 13a and 13b can have the same thickness and the first and second portions 130a and 130b can have the same thickness.

A first floating gate electrode 17a is provided on the first portion 13a, and a second floating gate electrode 17b is provided on the second portion 13b. In addition, a control gate electrode 14 is provided on the third portion 13c. The control gate electrode 14 is electrically insulated from the first floating gate electrode 17a and the second floating gate electrode 17b by an insulating film 12 having a thickness of 20 nm.

A third floating gate electrode 17c is provided on the first portion 130a, and a fourth floating gate electrode 17d is provided on the second portion 130b.

The third floating gate electrode 17c and the fourth floating gate electrode 17d are electrically insulated from the first and second floating gate electrodes 17a and 17b by insulating films 50a and 50b having a thickness of 20 nm.

Furthermore, the memory cell of the present example is covered with an interlevel insulator 18 formed on the silicon substrate 11. In the interlevel insulator 18, contact holes reaching the source region 24 and the drain region 25 are formed. Above the substrate 11, a source electrode 20S and a drain electrode 20D are provided. The source electrode 20S is provided so as to come into contact with the source region 24 through the contact hole, and the drain electrode 20D is provided so as to come into contact with the drain region 25.

According to the present example, the third and fourth floating gate electrodes 17c and 17d face the source and drain regions 24 and 25 via the second gate insulating thin film. Because of this structure, the third and fourth floating gate electrodes 17c and 17d can receive electrons from the source and drain regions 24 and 25 through the second gate insulating film. In other words, electrons do not move between the first floating gate electrode 17a and the third floating gate electrode 17c and between the second floating gate electrode 17b and the fourth floating gate electrode 17d.

The operation of the memory cell of the present example will be described with reference to FIGS. 19(a), 19(b), and 20(a) to 20(c).

First, a write operation will be described.

Figure 19A:
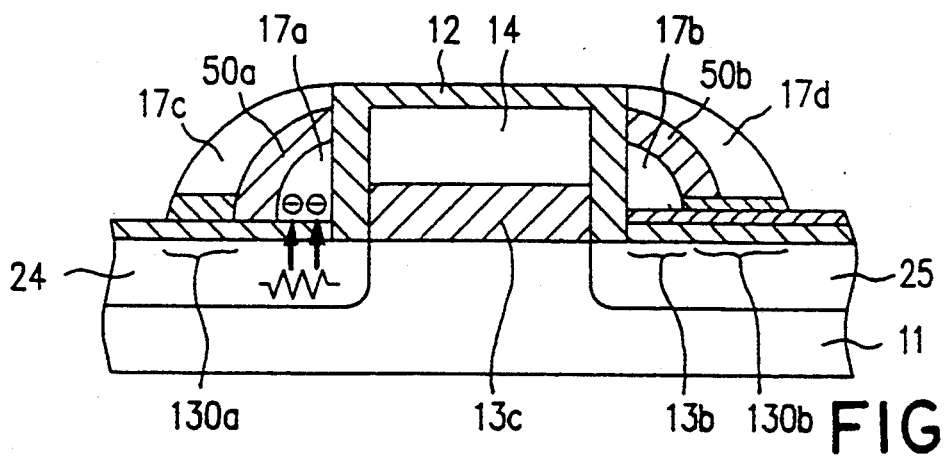
FIGS. 19(a) and 19(b) illustrate the operation of the memory cell shown in FIG. 18(d).

Electric potentials of 10 volts, 0 volt and 0 volt are respectively applied to the control gate electrode 14, the source region 24 (source electrode 20S) and the drain region 25 (drain electrode 20D). The electric potential of the control gate electrode 14 becomes 10 volts with respect to the source region 24 and the drain region 25. Because of the capacitive coupling of the floating gate electrodes 17a and 17b and the control gate electrode 14, the electric potentials of the floating gate electrodes 17a and 17b increase to a level required for generating an FN current. More specifically, when the electric potential of the control gate electrode 14 is increased from 0 volt to 10 volts within about 1 to 2 nanoseconds, the electric potentials of the floating gate electrodes 17a and 17b overshoot to temporarily increase to about 15 volts, for example. As a result, as shown in FIG. 19(a), electrons in the source region 24 pass through the first portion 13a because of the tunnel effect and are injected into the floating gate electrode 17a. At this time, an FN current does not flow through the second portion 13b and the second gate insulating film. This is because the respective thickness of the second portion 13b and the second gate insulating film is set so that the FN current hardly flows therethrough even though the electric potential of 10 volts is applied to the control gate electrode 14. After the electrons are injected into the floating gate electrode 17a, even though the electric potential of the control gate electrode 14 is decreased below 10 volts, the electrons are retained in the floating gate electrode 17a, because the floating gate electrode 17a is covered with the insulating films.

Next, the case where electrons are injected into the floating gate electrodes 17a and 17b will be described.

Figure 19B:
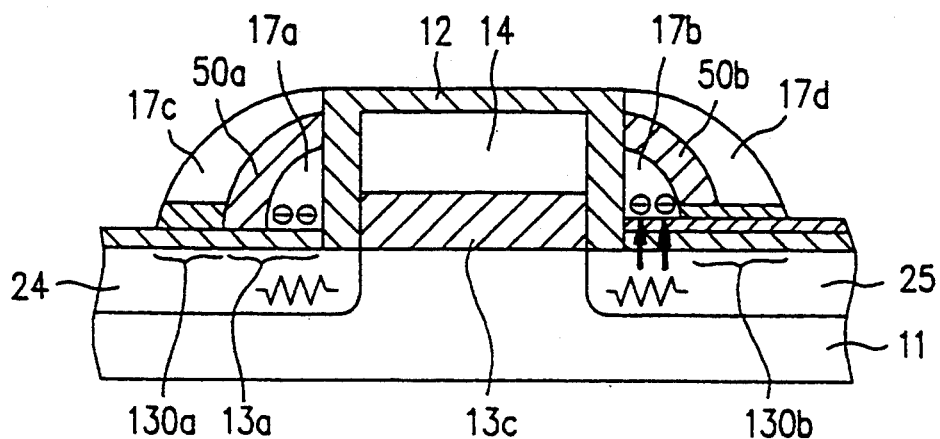

Electric potentials of 12.5 volts, 0 volt and 0 volt are respectively applied to the control gate electrode 14, the soure region 24 and the drain region 25. The electric potentials of the floating gate electrodes 17a and 17b with respect to the source region 24 and the drain region 25 increase to a level required for generating the FN current. More specifically, when the electric potential of the control gate electrode 14 is increased from 0 volt to 12.5 volts within about 1 to 2 nanoseconds, the electric potentials of the floating gate electrodes 17a and 17b overshoot to temporarily increase to about 15 volts, for example. As a result, as shown in FIG. 19(b), electrons in the source region 24 and the drain region 25 pass through the first and second portions 13a and 13b because of the tunnel effect and are injected into the floating gate electrodes 17a and 17b. After the electrons are injected into the floating gate electrodes 17a and 17b, even though the electric potential of the control gate electrode 14 is decreased below 12.5 volts, the electrons are retained in the floating gate electrodes 17a and 17b, because the floating gate electrodes 17a and 17b are respectively covered with the insulating films.

Figure 20A:
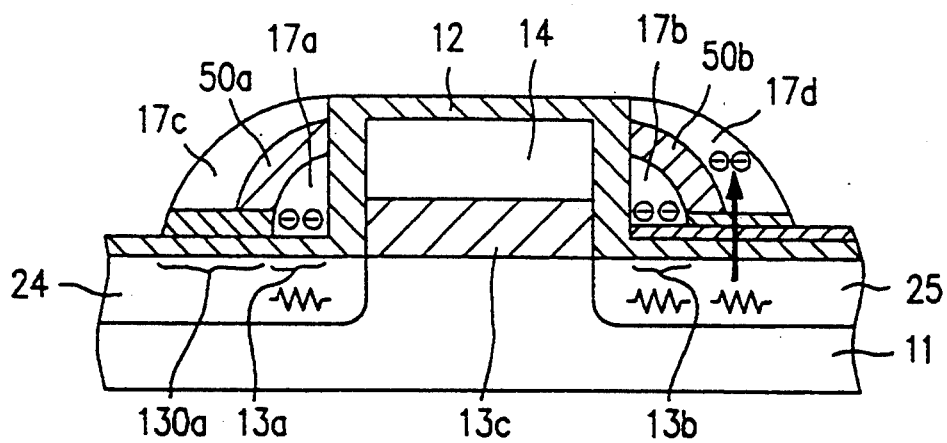
FIGS. 20(a) to 20(c) illustrate the operation of the memory cell shown in FIG. 18(d).

Electric potentialls of 15 volts, 0 volt and 0 volt are respectively applied to the control gate electrode 14, the source region 24 (source electrode 20S) and the drain region 25 (drain electrode 20D). The electric potential of the control gate electrode 14 becomes 15 volts with respect to the source region 24 and the drain region 25. Because of the capacitive coupling of the floating gate electrodes 17c and 17d and the control gate electrode 14, the electric potentials of the floating gate electrodes 17c and 17d increase to a level required for generating an FN current. More specifically, when the electric potential of the control gate electrode 14 is increased from 0 V to 15 volts within about 1 to 2 nanoseconds, the electric potentials of the floating gate electrodes 17c and 17d overshoot to temporarily increase to about 17.5 volts, and for example. As a result, as shown in FIG. 20(a), electrons in the source region 24 pass through the first portion 13a because of the tunnel effect and are injected into the floating gate electrode 17a. Simultaneously, electron in the drain region 25 pass through the second portions 13b and 130b because of the tunnel effect and are injected into the floating gate electrodes 17b and 17d. At this time, an FN current does not flow through the first portion 130a. This is because the thickness of the first portion 130a is set so that the FN current hardly flows therethrough even though the electric potential of 15 volts is applied to the control gate electrode 14. After the electrons are injected into the floating gate electrodes 17a, 17b, and 17d, even though the electric potential of the control gate electrode 14 is decreased below 15 volts, the electrons are retained in the floating gate electrodes 17a, 17b, and 17d because the floating gate electrodes 17a, 17b, and 17d are covered with the insulating films.

Next, the case where the electrons are injected into the floating gate electrodes 17a, 17b, 17c, and 17d will be described.

Figure 20B:
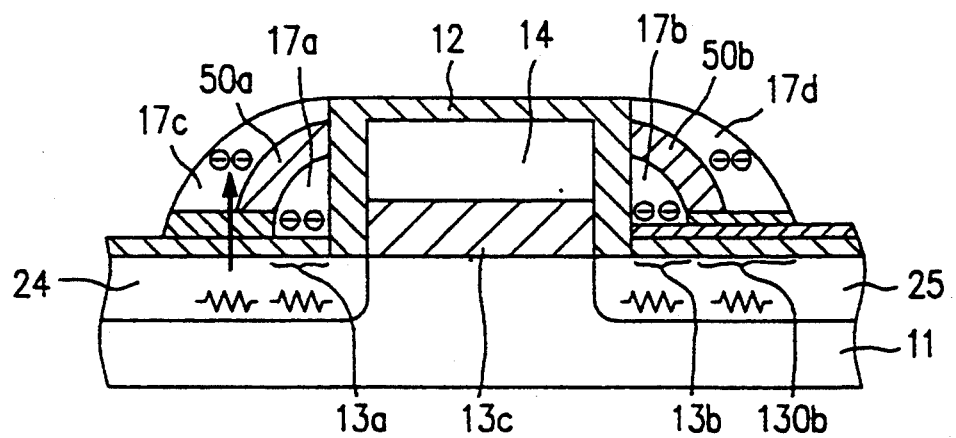
Figure 20C:
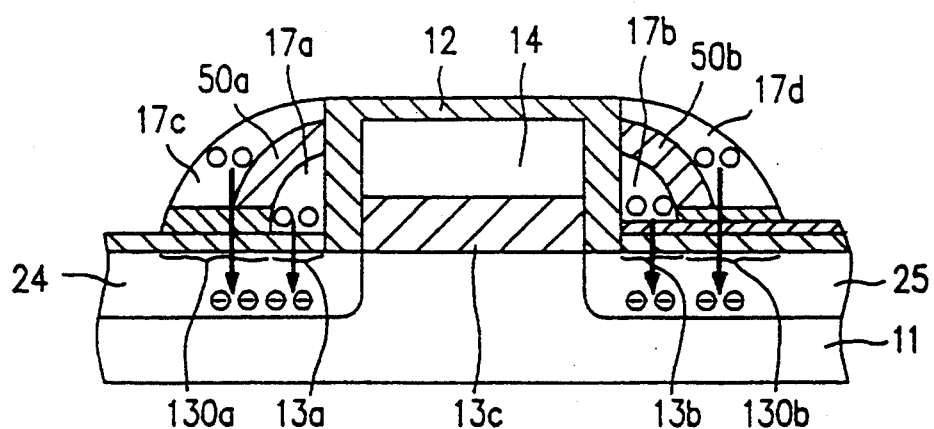

Electric potentials of 17.5 volts, 0 volt and 0 volt are respectively applied to the control gate electrode 14, the source region 24 and the drain region 25. The electric potentials of the floating gate electrodes 17a, 17b, 17c, and 17d with respect to the source region 24 and the drain region 25 increase to a level required for generating the FN current. More specifically, when the electrode potential of the control gate electrode 14 is increased from 0 volt to 17.5 volts within about 1 to 2 nanoseconds, the electric potentials of the floating gate electrodes 17a, 17b, 17c, and 17d overshoot to temporarily increase to about 20 volts, for example. As a result, as shown in FIG. 20(b), electrons in the source region 24 and the drain region 25 pass through the first and second gate insulating films because of the tunnel effect and are injected into the floating gate electrodes 17a, 17b, 17c, and 17d. After the electrons are injected into the floating gate electrodes 17a, 17b, 17c, and 17d even though the electric potential of the control gate electrode 14 is decreased below 20 volts, the electrons are retained in the floating gate electrodes 17a, 17b, 17c, and 17d because the floating gate electrodes 17a, 17b, 17c, and 17d are respectively covered with the insulating films.

Thus, in the memory cell of the present example, data of five values can be stored. The erase operation of the present example is conducted substantially in the same way as in that of the above-mentioned examples (FIG. 20(c)).

Next, a method for fabricating the above-mentioned memory cell will be described with reference to FIGS. 18(a) to 18(d).

A relatively thick oxide film (thickness: 20 nm) to be the third portion 13c is formed on the silicon substrate 11. Then, a polycrystalline silicon film is formed on the oxide film by a CVD method. The polycrystalline silicon film and the underlying oxide film are patterned to a predetermined wiring pattern by photolithography and etching to form the ocntrol gate electrode 14. In this way, the remaining thick oxide film (i.e., the third portion 13c) and the control gate electrode 14 cover the channel region in the silicon substrate 11, as shown in FIG. 18(a).

Then, As ions are implanted into the surface of the silicon substrate 11 using the control gate electrode 14 as a mask, and high concentration impurity diffusion regions (i.e., the source region 24 and the drain region 25) are formed in a self-alignment with the control gate electrode 14.

An insulating film 12 (thickness: 15 nm) which separates the floating gate electrode 17a from the control gate electrode 14 and the floating gate electrode 17b from the control gate electrode 14 is formed on both side faces and an upper face of the control gate electrode 14. After this, thin oxide films (thickness: 10 nm) are formed on the exposed surfaces of the silicon substrate 11. These thin oxide filsm correspond to the first portion 13a, a part of the second portion 13b, and a part of the second gate insualting film.

Another thin insulating film is selectively deposited on the thin oxide film positioned on the drain region 25, whereby the second portion 13b having a thickness larger than that of the first pattern 13a is formed.

Then, polycrystalline silicon is deposited over the entire surfae of the silicon substrate 11 by a CVD method so as to cover the thin oxide films. The polycrystalline silicon is etched from the above by an etching technique with high anisotrophy without using a mask. In this way, the polycrystalline silicon deposited on the regions other than those on both sides of the control gate electrode 14 is removed, thereby forming the floating gate electrodes 17a and 17b of a side wall type on both sides of the control gate electrode 14 (FIG. 18(b)).

Relatively thick insulating films 50a and 50b are respectively formed on the floating gate electrodes 17a and 17b. The insulating films 50a and 50b electrically insulate the floating gate electrodes 17c and 17d from the floating gate electrodes 17a and 17b.

Thin oxide films to be a part of second gate insulating film are deposited on the thin oxide films respectively positioned on the source and drain regions 24 and 25 by a CVD method. At this time, the thickness of the oxide film above the source region 24 is selectively made larger than that of the oxide film above the drain region 25. Thus, the second gate insulating film including the first portion 130a and the second portion 130b is formed.

Furthermore, polycrystalline silicon is deposited so as to cover the second gate insulating film by a CVD method. The polycrystalline silicon is etched from the above by an etching technique with high anistropy without using a mask. In this way, the polycrystalline silicon deposited on the regions other than those on both sides of the control gate electrode 14 is removed, thereby forming the floating gate electrodes 17c and 17d of a side wall type on both sides of the control gate electrode 14(FIG. 18(c)).

Thereafter, the interlevel insulator 18 is formed, the contact holes are formed in the interlevel insulator 18, and the source electrode 20S and the drain electrode 20D are formed by an ordinary technique. Thus, a structure as shown in FIG. 18(d) is obtained.

Example 7

Figure 21A:
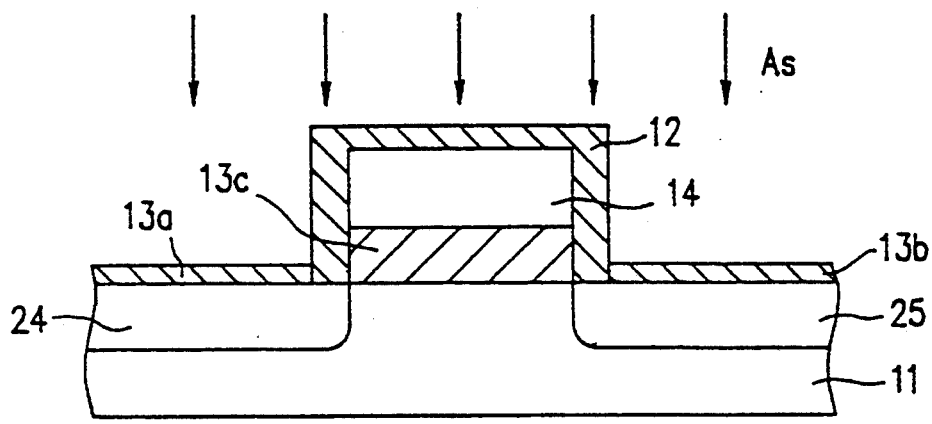
FIGS. 21(a) to 21(d) are cross-sectional views of another non-volatile memory cell according to the present invention, showing the steps of the fabrication thereof.
Figure 21B:
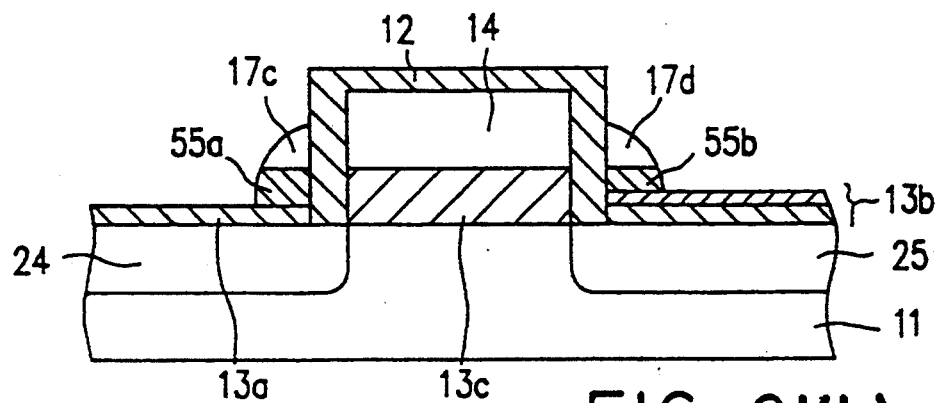
Figure 21C:
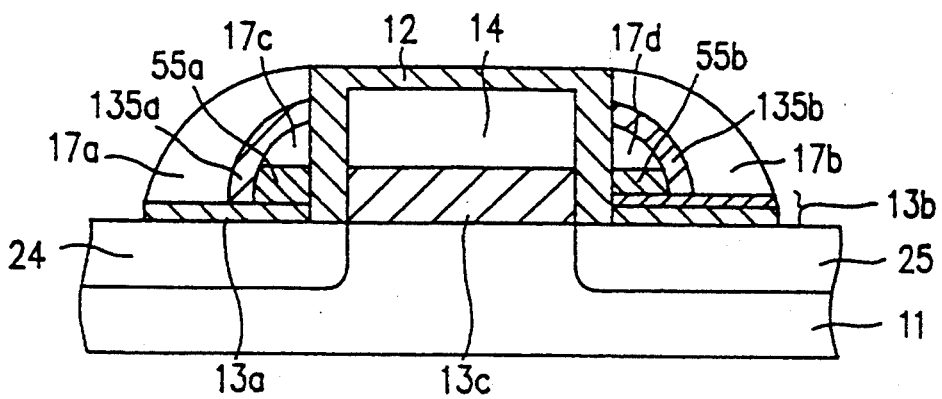
Figure 21D:
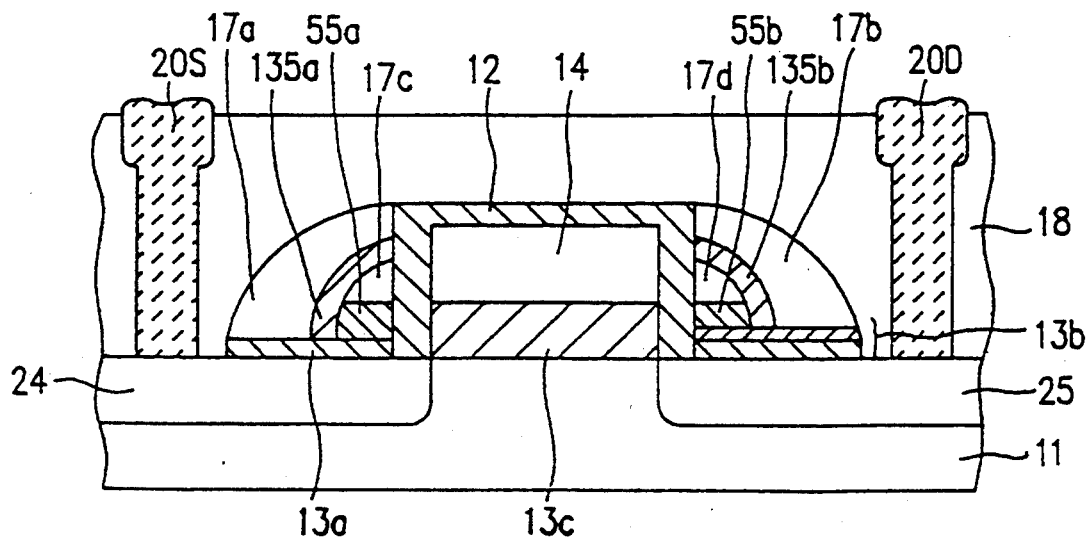

FIG. 21(d) is a cross-sectional view of another nonvolatile memory cell of a side wall accumulation type according to the present invention. The present invention will be described by way of an exemplary memory cell fabricated by using a CMOS process for fabricating an LSI with a minimum size of 0.5 to 1.0 μm.

This memory cell includes an n-type source region 24 and an n-type drain region 25 facing each other at a certain distance (about 0.25 μm) and a channel region positioned between the source region 24 and the drain region 25. The source region 24 and the drain region 25 are provided in the upper portion of a p-type silicon substrate 11. The source region 24 and the drain region 25 are typically an impurity diffusion region with a thickness of about 0.1 μm. The surface concentration of n-type impurities doped in the impurity diffusion regions is $10^{20}$ cm$^{-3}$ to $10^{21}$ cm$^{-3}$. In the silicon substrate 11, p-type impurities with a surface concentration of about $10^{17}$ cm$^{-3}$ are doped.

On the silicon substrate 11, a thin oxide film working as a first gate insulating film is provided. The first gate insulating film includes a first portion 13a, a second portion 13b, and a third portion 13c. The first portion 13a has a thickness of 10 nm and covers one part of the source region 24, the second portion 13b has a thickness of 12.5 nm and covers one part of the drain region 25, and the third portion 13c has a thickness of 20 nm and covers the channel region. On the third portion 13c, a control gate 14 is provided. The upper face and side faces of the control gate 14 is covered with a thick insulating film 12. On part of the first and second portions 13a and 13b (i.e., on the side of the control gate 14), a pair of thick insulating films 55a and 55b are formed. Third and fourth floating gate electrodes 17c and 17d are respectively provided on the pair of thick insulating films 55a and 55b.

In the present example, the first and second floating gate electrodes 17a and 17b are provided outside of the third and fourth floating gate electrodes 17c and 17d. A first portion 135a of a second gate insulating film is provided between the first floating gate electrode 17a and the third floating gate electrode 17c, and a second portion 135b of the second gate insulating film is provided between the second floating gate electrode 17b and the fourth floating gate electrode 17d.

The thickness of the first portion 13a is smaller than that of the second portion 13b, and the thickness of the first portion 135a is larger than that of the second portion 135b. The purpose of this structure is to make the memory cell store data of five values. For storing data of three values, the first and second portions 13a and 13b can have the same thickness and the first and second portions 135a and 135b can have the same thickness.

Furthermore, as shown in FIG. 21(d), the memory cell of the present example is covered with an interlevel insulator 18 formed on the silicon substrate 11. In the interlevel insulator 18, contact holes reaching the source region 24 and the drain region 25 are formed. Above the substrate 11, a source electrode 20S and a drain electrode 20D are provided. The source electrode 20S is provided so as to come into contact with the source region 24 through the contact hole, and the drain electrode 20D is provided so as to come into contact with the drain region 25.

According to the present example, the third and fourth floating gate electrodes 17c and 17d face the source and drain regions 24 and 25 via the thick insulating films 55a and 55b. Because of this structure, the third and fourth floating gate electrodes 17c and 17d can receive electrons from the source and drain regions 24 and 25 through the first and second floating gate electrodes 17a and 17b. In other words, electrons do not move between the first and second floating gate electrodes 17c and 17d and the source and drain regions 24 and 25.

The operation of the memory cell of the present example will be described with reference to FIGS. 22(a), 22(b), and 23(a) to 23(c).

First, a write operation will be described.

Figure 22A:
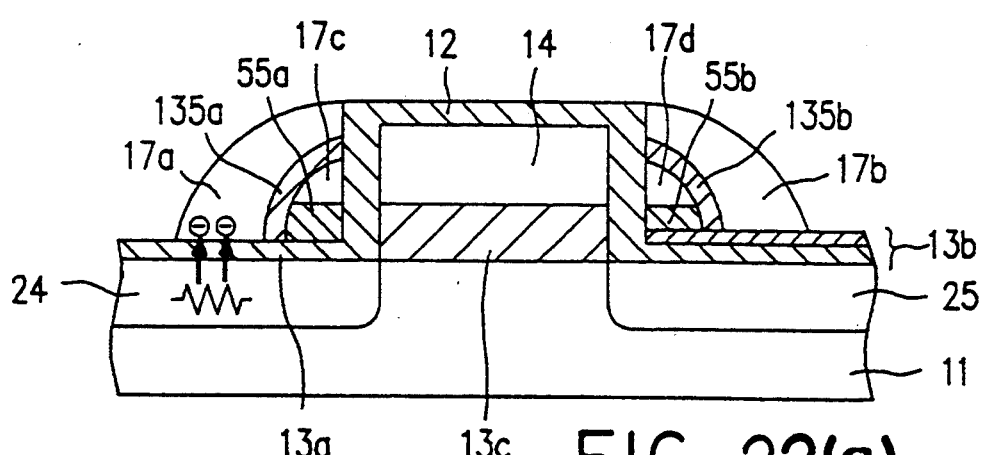
FIGS. 22(a) and 22(b) illustrate the operation of the memory cell shown in FIG. 21(d).

Electric potentials of 10 volts, 0 volt and 0 volt are respectively applied to the control gate electrode 14, the source region 24 (source electrode 20S) and the drain region 25 (drain electrode 20D). The electric potential of the control gate electrode 14 becomes 10 volts with respect to the source region 24 and the drain region 25. Because of the capacitive coupling of the floating gate electrodes 17a, 17b, 17c, and 17d and the control gate electrode 14, the electric potentials of the floating gate electrodes 17a, 17b, 17c, and 17d increase to a level required for generating an FN current. More specifically, when the electric potential of the control gate electrode 14 is increased from 0 volt to 10 volts within about 1 to 2 nanoseconds, the electric potentials of the floating gate electrodes 17a, 17b, 17c, and 17d overshoot to temporarily increase to about 15 volts, for example. As a result, as shown in FIG. 22(a), electrons in the source region 24 pass through the first portion 13a because of the tunnel effect and are injected into the floating gate electrode 17a. At this time, an FN current does not flow through the second portion 13b. This is because the thickness of the second portion 13b is set so that the FN current hardly flows therethrough even though the electric potential of 10 volts is applied to the control gate electrode 14. After the electrons are injected into the floating gate electrode 17a, even though the electric potential of the control gate electrode 14 is decreased below 10 volts, the electrons are retained in the floating gate electrode 17a, because the floating gate electrode 17a is covered with the insulating films.

Next, the case where electrons are injected into the floating gate electrodes 17a and 17b will be described.

Figure 22B:
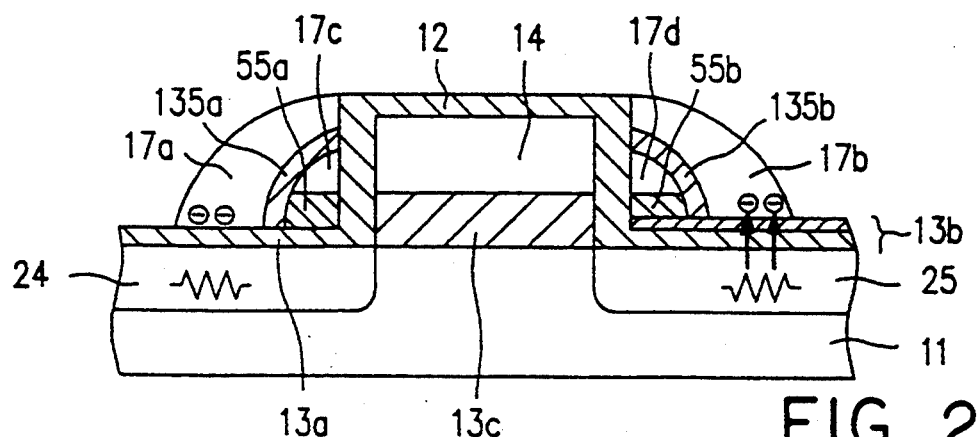

Electric potentials of 12.5 volts, 0 volt and 0 volt are respectively applied to the control gate electrode 14, the source region 24 and the drain region 25. The electric potentials of the floating gate electrodes 17a and 17b with respect to the source region 24 and the drain region 25 increase to a level required for generating the FN current. More specifically, when the electric potential of the control gate electrode 14 is increased from 0 volt to 12.5 volts within about 1 to 2 nanoseconds, the electric potentials of the floating gate electrodes 17a and 17b overshoot to temporarily increase to about 15 volts, for example. As a result, as shown in FIG. 22(b), electrons in the source region 24 and the drain region 25 pass through the first and second portions 13a and 13b because of the tunnel effect and are injected into the floating gate electrodes 17a and 17b. After the electrons are injected into the floating gate electrodes 17a and 17b, even though the electric potential of the control gate electrode 14 is decreased below 12.5 volts, the electrons are retained in the floating gate electrodes 17a and 17b, because the floating gate electrodes 17a and 17b are respectively covered with the insulating films.

Figure 23A:
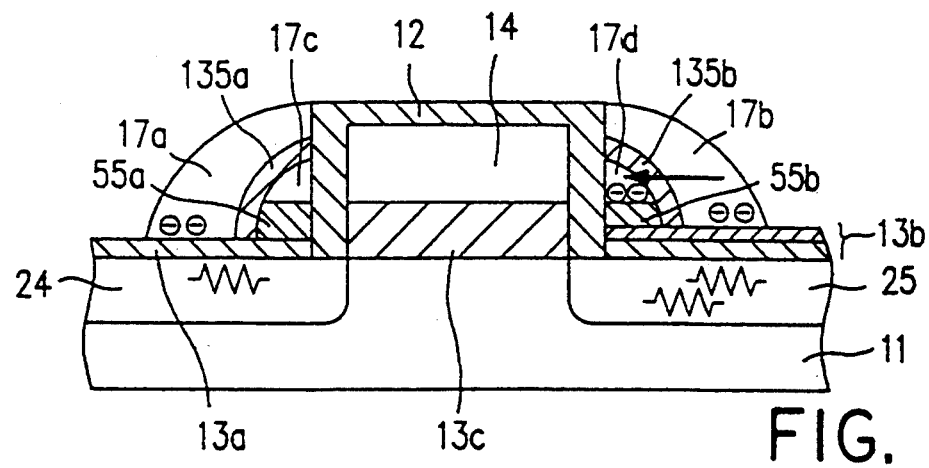
FIGS. 23(a) to 23(c) illustrate the operation of the memory cell shown in FIG. 21(d).

Electric potentials of 15 volts, 0 volt and 0 volt are respectively applied to the control gate electrode 14, the source region 24 (source electrode 20S) and the drain region 25 (drain electrode 20D). The electric potential of the control gate electrode 14 becomes 15 volts with respect to the source region 24 and the drain region 25. Because of the capacitive coupling of the floating gate electrodes 17a, 17b, 17c and 17d and the control gate electrode 14, the electric potentials of the floating gate electrodes 17a, 17b, 17c and 17d increase to a level required for generating an FN current. More specifically, when the electric potential of the control gate electrode 14 is increased from 0 volt to 15 volts within about 1 to 2 nanoseconds, the electric potentials of the floating gate electrodes 17a, 17b, 17c and 17d overshoot to temporarily increase to about 17.5 volts, for example. As a result, as shown in FIG. 23(a), electrons in the source region 24 pass through the first portion 13a because of the tunnel effect and are injected into the floating gate electrode 17a. Simultaneously, electrons in the drain region 25 pass through the second portions 13b and 135b because of the tunnel effect and are injected into the floating gate electrodes 17b and 17d. At this time, an FN current does not flow through the first portion 135a. This is because the thickness of the first portion 135a is set so that the FN current hardly flows therethrough even though the electric potential of 15 volts is applied to the control gate electrode 14. After the electrons are injected into the floating gate electrodes 17a, 17b, and 17d, even though the electric potential of the control gate electrode 14 is decreased below 15 volts, the electrons are retained in the floating gate electrodes 17a, 17b, and 17d because the floating gate electrodes 17a, 17b, and 17d are covered with the insulating films.

Next, the case where electrons are injected into the floating gate electrodes 17a, 17b, 17c, and 17d will be described.

Figure 23B:
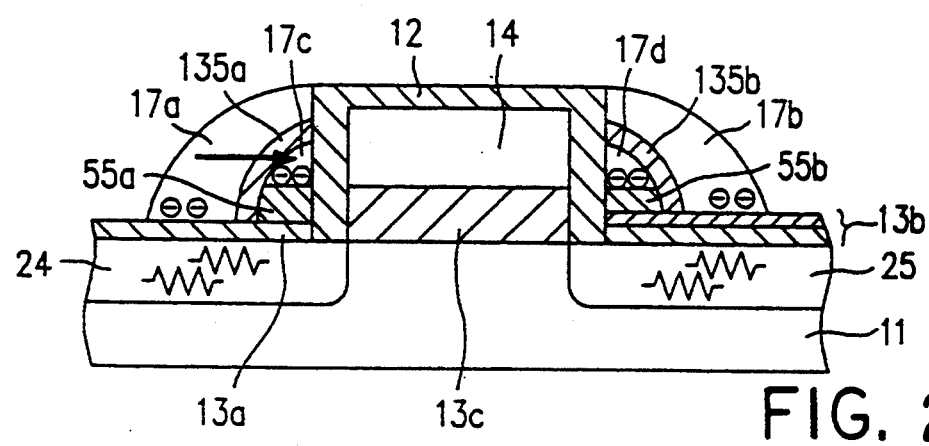
Figure 23C:
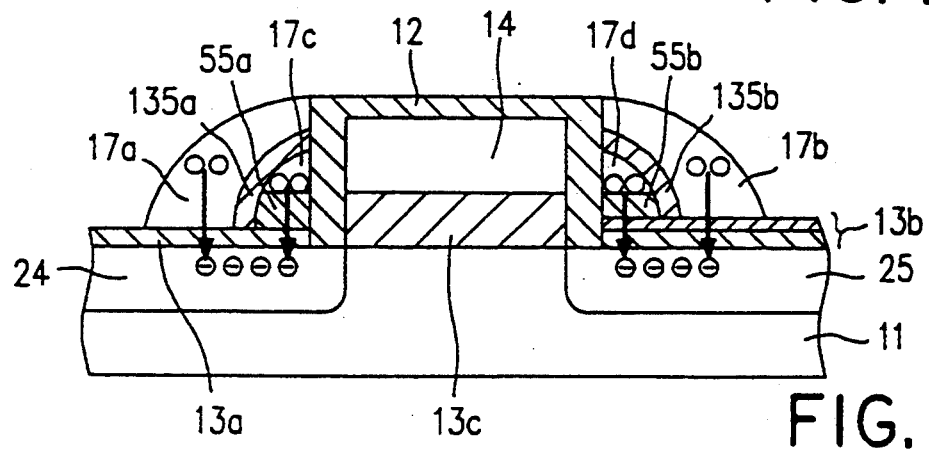

Electric potentials of 17.5 volts, 0 volt and 0 volt are respectively applied to the control gate electrode 14, the source region 24 and the drain region 25. The electric potentials of the floating gate electrodes 17a, 17b, 17c, and 17d with respect to the source region 24 and the drain region 25 increase to a level required for generating the FN current. More specifically, when the electric potential of the control gate electrode 14 is increased from 0 volt to 17.5 volts within about 1 to 2 nanoseconds, the electric potentials of the floating gate electrodes 17a, 17b, 17c, and 17d overshoot to temporarily increase to about 20 volts, for example. As a result, as shown in FIG. 23(b), electrons in the source region 24 and the drain region 25 pass through the first and second gate insulating films because of the tunnel effect and are injected into the floating gate electrodes 17a, 17b, 17c, and 17d. After the electrons are injected into the floating gate electrodes 17a, 17b, 17c, and 17d even though the electric potential of the control gate electrode 14 is decreased below 20 volts, the electrons are retained in the floating gate electrodes 17a, 17b, 17c, and 17d because the floating gate electrodes 17a, 17b, 17c, and 17d are respectively covered with the insulating films.

Thus, in the memory cell of the present example, data of five values can be stored. The erase operation of the present example is conducted substantially in the same way as in that of the above-mentioned examples (FIG. 23(c)).

Next, a method for fabricating the above-mentioned memory cell will be described with reference to FIGS. 21(a) to 21(d).

A relatively thick oxide film (thickness: 20 nm) to be the third portion 13c is formed on the silicon substrate 11. Then, a polycrystalline silicon film is formed on the oxide film by a CVD method. The polycrystalline silicon film and the underlying oxide film are patterned to a predetermined wiring pattern by photolithography and etching to form the control gate electrode 14. In this way, the remaining thick oxide film (i.e., the third portion 13c) and the control gate electrode 14 cover the channel region in the silicon substrate 11, as shown in FIG. 21(a).

Then, as ions are implanted into the surface of the silicon substrate 11 using the control gate electrode 14 as a mask, and high concentration impurity diffusion regions (i.e., the source region 24 and the drain region 25) are formed in a self-alignment with the control gate electrode 14.

An insulating film 12 (thickness: 20 nm) which separates the floating gate electrode 17a from the control gate electrode 14 and the floating gate electrode 17b from the control gate electrode 14 is formed on both side faces and an upper face of the control gate electrode 14. After this, thin oxide films (thickness: 10 nm) are formed on the exposed surfaces of the silicon substrate 11. These thin oxide films correspond to the first portion 13a and a part of the second portion 13b.

Another thin oxide film is selectively deposited on the thin oxide film positioned on the drain region 25, whereby the second portion 13b having a thickness larger than that of the first portion 13a is formed.

The thick oxide films 55a and 55b are formed so as to cover a part of the first portion 13a and the second portion 13b. The thick oxide films 55a and 55b electrically insulate the third and fourth floating gate electrodes 17c and 17d from the substrate 11.

Then, polycrystalline silicon is deposited over the entire surface of the silicon substrate 11 by a CVD method so as to cover the thick oxide films 55a and 55b. The polycrystalline silicon is etched from the above by an etching technique with high anisotropy without using a mask. In this way, the polycrystalline silicon deposited on the regions other than those on both sides of the control gate electrode 14 is removed, thereby forming the floating gate electrodes 17c and 17d of a side wall type on both sides of the control gate electrode 14 (FIG. 21(b)).

Then, the first portion 135a and the second portion 135b are formed by a CVD method on the floating gate electrode 17c and the floating gate electrode 17d, respectively. In the present example, the thickness of the first portion 135a is made larger than that of the second portion 135b.

Furthermore, polycrystalline silicon is deposited so as to cover the first and second portions 135a and 135b by a CVD method. The polycrystalline silicon is etched from the above by an etching technique with high anisotropy without using a mask. In this way, the polycrystalline silicon deposited on the regions other than those on both sides of the control gave electrode 14 is removed, thereby forming the floating gate electrodes 17a and 17b of a side wall type on both sides of the control gate electrode 14 (FIG. 21(c)).

Thereafter, the interlevel insulator 18 is formed, the contact holes are formed in the interlevel insulator 18, and the source electrode 20S and the drain electrode 20D are formed by an ordinary technique. Thus, a structure as shown in FIG. 21(d) is obtained.

According to the present invention, the control gate electrode is capacity-coupled with the floating gate electrodes provided above the source and drain regions. Therefore, the electrons can be injected into desired floating gate electrodes from the source region and/or the drain region by controlling the voltage to be applied to the control gate electrode. In this structure, the diffusion layer resistance of the source region and/or the drain region is changed depending upon the quantity of the electric carriers accumulated in the floating gate electrode positioned above the source region and/or the drain region. As a result, the change in resistance of the source region or the drain region can be detected by detecting the level of the drain current during reading data.

Accordingly, a non-volatile memory cell of a side wall accumulation type in which data of a number of values can be stored is provided. In addition, since the hot electrons are hardly injected into the gate insulating film under the control gate electrode, data can be read with high reliability.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A non-volatile memory cell comprising:
   a semiconductor layer of a first conductivity type having an upper portion;
   a pair of impurity diffusion regions of a second conductivity type provided in the upper portion of the semiconductor layer, facing each other at a certain distance;
   a channel region provided between the pair of impurity diffusion regions in the upper portion of the semiconductor layer;
   a gate insulating film provided on the upper portion of the semiconductor layer, having thin portions covering at least part of the pair of impurity diffusion regions and a thick portion covering the channel region;
   floating gate electrodes provided on the thin portions of the gate insulating film;
   a control gate electrode provided on the thick portion of the gate insulating film and electrically insulated from the floating gate electrodes; and
   an insulating film provided between the control gate electrode and the floating gate electrodes, capacity-coupling the control gate electrode with the floating gate electrodes,
   wherein, during writing data, part of electric carriers in the impurity diffusion regions are injected into the floating gate electrodes through the thin portions of the gate insulating film so as to form a Fowler-Nordheim current, depending upon a voltage to be applied to the control gate electrode, whereby electric resistance of the impurity diffusion regions is changed.

2. A non-volatile memory cell according to claim 1, wherein the thin portions have substantially the same thickness.

3. A non-volatile memory cell according to claim 1, wherein the thin portions have a thickness of approximately 5 nanometers or more.

4. A non-volatile memory cell according to claim 1, wherein the floating gate electrodes are connected to each other on an upper surface of the control gate electrode.

5. A non-volatile memory cell according to claim 1, wherein at least one of the thin portions has a multi-layered structure.

6. A non-volatile memory cell according to claim 5, wherein the multi-layered structure includes an oxide film and a silicon nitride film.

7. A non-volatile memory cell according to claim 1, wherein the thin portions have different thicknesses.

8. A non-volatile memory cell according to claim 7, wherein at least one of the thin portions has a multi-layered structure.

9. A non-volatile memory cell according to claim 7, wherein logic data corresponding to three different values can be stored in the memory cell.

10. A non-volatile memory cell comprising:
a semiconductor layer of a first conductivity type having an upper portion;
a pair of impurity diffusion regions of a second conductivity type provided in the upper portion of the semiconductor layer, facing each other at a certain distance;
a channel region provided between the pair of impurity diffusion regions in the upper portion of the semiconductor layer;
a gate insulating film provided on the upper portion of the semiconductor layer, having thin portions covering at least part of the pair of impurity diffusion regions and a thick portion covering the channel region;
at least one floating gate electrode provided on a respective one of the thin portions of the gate insulating film;
a control gate electrode provided on the thick portion of the gate insulating film and electrically insulated from the at least one floating gate electrode; and
an insulating film provided between the control gate electrode and the at least one floating gate electrode, capacity-coupling the control gate electrode with the at least one floating gate electrode,
wherein, during writing data, part of electric carriers in the impurity diffusion regions are injected into the at least one floating gate electrodes through the respective one of the thin portions of the gate insulating film so as to form a Fowler-Nordheim current, depending upon a voltage to be applied to the control gate electrode, whereby electric resistance of the impurity diffusion region covered by the respective one of the thin portions of the gate insulating film is changed.

11. A non-volatile memory cell comprising:
a semiconductor layer of a first conductivity type having an upper portion;
a source region of a second conductivity type and a drain region of the second conductivity type provided in the upper portion of the semiconductor layer, facing each other at a certain distance;
a channel region provided between the source region and the drain region in the upper portion of the semiconductor layer;
a first gate insulating film provided on the upper portion of the semiconductor layer, having a first portion covering a part of the source region, a second portion covering a part of the drain region, and a third portion covering the channel region;
an insulating film provided on the upper portion of the semiconductor layer, having a first portion covering another part of the source region and a second portion covering another part of the drain region;
a first floating gate electrode provided on the first portion of the first gate insulating film;
a second floating gate electrode provided on the second portion of the first gate insulating film;
a third floating gate electrode provided on the first portion of the insulating film;
a fourth floating gate electrode provided on the second portion of the insulating film;
a first portion of a second gate insulating film providing between the first floating gate electrode and the third floating gate electrode; and
a second portion of the second gate insulating film provided between the second floating gate electrode and the fourth floating gate electrode,
wherein the first, second, third, and fourth floating gate electrodes are capacity-coupled with the control gate electrode,
wherein, during writing data, part of electric carriers in the source region and/or the drain region are injected into the first floating gate electrode and/or the second floating gate electrode through the first portion and/or the second portion of the first gate insulating film and are injected into the third floating gate electrode and/or the fourth floating gate insulating film and/or the second portion of the second gate insulating film so as to form a Fowler-Nordheim current, depending upon a voltage to be applied to the control gate electrode.

12. A non-volatile memory cell comprising:
a semiconductor layer of a first conductivity type having an upper portion;
a source region of a second conductivity type and a drain region of the second conductivity type provided in the upper portion of the semiconductor layer, facing each other at a certain distance;
a channel region provided between the source region and the drain region in the upper portion of the semiconductor layer;
a first gate insulating film providing on the upper portion of the semiconductor layer, having a first portion covering at least part of the source region, a second portion covering at least part of the drain region, and a third portion covering the channel region;
a first floating gate electrode provided on the first portion of the first gate insulating film;
a second floating gate electrode provided on the second portion of the first gate insulating film;

a control gate electrode provided on the third portion of the first gate insulating film and electrically insulated from the first and second floating gate electrodes;

a first insulating film provided between the control gate electrode and the first floating gate electrode, capacity-coupling the control gate electrode with the first floating gate electrode; and a second insulating film provided between the control gate electrode and the second floating gate electrode, capacity-coupling the control gate electrode with the second floating gate electrode, wherein a degree of capacitive coupling due to the first insulating film is different from a degree of capacitive coupling due to the second insulating film, wherein, during writing data, part of electric carriers in the source region and/or the drain region are injected into the first floating gate electrode and/or the second floating gate electrode through the first portion and/or the second portion of the first gate insulating film so as to form a Fowler-Nordheim current, depending upon a voltage to be applied to the control gate electrode.

13. A non-volatile memory cell according to claim 12, wherein a thickness of the first insulating film is different from a thickness of the second insulating film.

14. A non-volatile memory cell according to claim 12, wherein a dielectric constant of the first insulating film is different from a dielectric constant of the second insulating film.

15. A non-volatile memory cell according to claim 12, further comprising:

a second gate insulating film provided so as to cover the first and second floating gate electrodes, having a first portion covering the first floating gate electrode and a second portion covering the second floating gate electrode;

a third floating gate electrode provided on the first portion of the second gate insulating film; and a fourth floating gate electrode provided on the second portion of the second gate insulating film, wherein the third and fourth floating gate electrodes are capacity-coupled with the control gate electrode, wherein, during writing data, part of electric carriers in the source region and/or the drain region are injected into the first floating gate electrode and/or the second floating gate electrode through the first portion and/or the second portion of the first gate insulating film and are injected into the third floating gate electrode and/or the fourth floating gate electrode through the first portion and/or the second portion of the second gate insulating film so as to form a Fowler-Nordheim current, depending upon a voltage to be applied to the control gate electrode.

16. A non-volatile memory cell comprising:

a semiconductor layer of a first conductivity type having an upper portion;

a source region of a second conductivity type and a drain region of the second conductivity type provided in the upper portion of the semiconductor layer, facing each other at a certain distance;

a channel region provided between the source region and the drain region in the upper portion of the semiconductor layer;

a first gate insulating film provided on the upper portion of the semiconductor layer, having a first portion covering at least part of the source region, a second portion covering at least part of the drain region, and a third portion covering the channel region;

a first floating gate electrode provided on the first portion of the first gate insulating film;

a second floating gate electrode provided on the second portion of the first gate insulating film;

a control gate electrode provided on the third portion of the first gate insulating film and electrically insulated from the first and second floating gate electrodes;

a second gate insulating film provided so as to cover the first and second floating gate electrodes, having a first portion covering the first floating gate electrode and a second portion covering the second floating gate electrode;

a third floating gate electrode provided on the first portion of the second gate insulating film; and a fourth floating gate electrode provided on the second portion of the second gate insulating film, wherein the first, second, third, and fourth floating gate electrodes are capacity-coupled with the control gate electrode, wherein, during writing data, part of electric carriers in the source region and/or the drain region are injected into the first floating gate electrode and/or the second floating gate electrode through the first portion and/or the second portion of the first gate insulating film and are injected into the third floating gate electrode and/or the fourth floating gate electrode through the first portion and/or the second portion of the second gate insulating film so as to form a Fowler-Nordheim current, depending upon a voltage to be applied to the control gate electrode.

17. A non-volatile memory cell according to claim 16, wherein a thickness of the first portion of the second gate insulating film is equal to a thickness of the second portion of the second gate insulating film.

18. A non-volatile memory cell according to claim 16, wherein a thickness of the first portion of the first gate insulating film is equal to a thickness of the second portion of the first gate insulating film.

19. A non-volatile memory cell according to claim 18, wherein the control gate electrode completely covers the channel region.

20. A non-volatile memory cell according to claim 16, wherein the thickness of the first portion of the first gate insulating film is smaller than the thickness of the second portion of the first gate insulating film.

21. A non-volatile memory cell according to claim 20, wherein the thickness of the second portion of the second gate insulating film is smaller than the thickness of the first portion of the second gate insulating film.

22. A non-volatile memory cell comprising:

a semiconductor layer of a first conductivity type having an upper portion;

a source region of a second conductivity type and a drain region of the second conductivity type provided in the upper portion of the semiconductor layer, facing each other at a certain distance;

a channel region provided between the source region and the drain region in the upper portion of the semiconductor layer;

a first gate insulating film provided on the upper portion of the semiconductor layer, having a first portion covering one part of the source region, a second portion covering one part of the drain region, and a third portion covering the channel region;

a second gate insulating film provided on the upper portion of the semiconductor layer, having a first portion covering another part of the source region, and a second portion covering another part of the drain region;

a first floating gate electrode provided on the first portion of the first gate insulating film;

a second floating gate electrode provided on the second portion of the first gate insulating film;

a control gate electrode provided on the third portion of the first gate insulating film and electrically insulating from the first and second floating gate electrodes;

a third floating gate electrode provided on the first portion of the second gate insulating film; and a fourth floating gate electrode provided on the second portion of the second gate insulating film, wherein the first, second, third, and fourth floating gate electrodes are capacity-coupled with the control gate electrode, wherein, during writing date, part of electric carriers in the source region and/or the drain region are injected into the first floating gate electrode and/or the second floating gate electrode through the first portion and/or the second portion of the first gate insulating film and are injected into the third floating gate electrode and/or the fourth floating gate electrode through the first portion and/or the second portion of the second gate insulating film so as to form a Fowler-Nordheim current, depending upon a voltage to be applied to the control gate electrode.

23. A non-volatile memory cell according to claim 22, wherein a thickness of the first portion of the first gate insulating film is equal to a thickness of the second portion of the first gate insulating film.

24. A non-volatile memory cell according to claim 22, wherein a thickness of the first portion of the second gate insulating film is equal to a thickness of the second portion of the second gate insulating film.

25. A non-volatile memory cell according to claim 22, wherein the control gate electrode completely covers the channel region.

26. A non-volatile memory cell according to claim 22, wherein the thickness of the first portion of the first gate insulating film is smaller than the thickness of the second portion of the first gate insulating film.

27. A non-volatile memory cell according to claim 26, wherein the thickness of the second portion of the second gate insulating film is smaller than the thickness of the first portion of the second gate insulating film.

* * * * *

UNITED STATES PATENT AND TRADEMARK OFFICE
CERTIFICATE OF CORRECTION

PATENT NO. : 5,424,979
DATED : June 13, 1995
INVENTOR(S) : TOMOYUKI MORII

It is certified that error appears in the above-indentified patent and that said Letters Patent is hereby corrected as shown below:

On the title page, after item [30] Foreign Application Priority Data, insert the following:

| October 2, 1992 | [JP] | Japan.............................. | 4-264518 |
| February 8, 1993 | [JP] | Japan................................ | 5-019846 |

Signed and Sealed this

Seventh Day of November, 1995

Attest:

BRUCE LEHMAN

Attesting Officer

Commissioner of Patents and Trademarks